United States Patent
Rizzolo et al.

(10) Patent No.: US 10,714,683 B2
(45) Date of Patent: Jul. 14, 2020

(54) MULTILAYER HARDMASK FOR HIGH PERFORMANCE MRAM DEVICES

(71) Applicant: International Business Machines Corporation, Armonk, NY (US)

(72) Inventors: Michael Rizzolo, Delmar, NY (US); Daniel C. Edelstein, White Plains, NY (US); Theodorus E. Standaert, Clifton Park, NY (US); Kisup Chung, Slingerlands, NY (US); Isabel C. Chu, Westchester, NY (US); John C. Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/719,164

(22) Filed: Dec. 18, 2019

(65) Prior Publication Data

US 2020/0144491 A1 May 7, 2020

Related U.S. Application Data

(62) Division of application No. 16/007,644, filed on Jun. 13, 2018.

(51) Int. Cl.
*H01L 43/12* (2006.01)
*H01L 43/02* (2006.01)
*H01L 27/22* (2006.01)

(52) U.S. Cl.
CPC ............ *H01L 43/12* (2013.01); *H01L 27/222* (2013.01); *H01L 43/02* (2013.01)

(58) Field of Classification Search
None
See application file for complete search history.

(56) References Cited

U.S. PATENT DOCUMENTS

| 7,993,535 | B2 | 8/2011 | Jiang et al. |
| 9,041,146 | B2* | 5/2015 | Lee .................... H01L 43/12 |
| | | | 257/506 |
| 9,269,893 | B2 | 2/2016 | Lu et al. |
| 9,425,388 | B2 | 8/2016 | Tomioka et al. |
| 2005/0051820 | A1* | 3/2005 | Stojakovic ............. G11C 11/22 |
| | | | 257/295 |
| 2009/0209050 | A1 | 8/2009 | Wang et al. |
| 2013/0119494 | A1 | 5/2013 | Li et al. |
| 2015/0188033 | A1 | 7/2015 | Lamborn et al. |
| 2015/0357559 | A1 | 12/2015 | Nagel et al. |
| 2016/0308112 | A1* | 10/2016 | Tan ................... H01J 37/32651 |
| 2017/0033283 | A1 | 2/2017 | Pinarbasi et al. |
| 2017/0222134 | A1 | 8/2017 | Annunziata et al. |

(Continued)

OTHER PUBLICATIONS

List of IBM Patents or Patent Applications Treated as Related Dated Dec. 18, 2019, 2 Pages.

*Primary Examiner* — Ali Naraghi
(74) *Attorney, Agent, or Firm* — Scully, Scott, Murphy & Presser, P.C.; Daniel P. Morris, Esq.

(57) ABSTRACT

Multilayered hardmask structures are provided which can prevent degradation of the performance of a magnetic tunnel junction (MTJ) structure. The multilayered hardmask structures include at least a halogen barrier hardmask layer and an upper hardmask layer. The halogen barrier hardmask layer can prevent halogen ions that are used to pattern the upper hardmask layer from diffusing into the MTJ structure.

17 Claims, 18 Drawing Sheets

(56) References Cited

U.S. PATENT DOCUMENTS

| | | |
|---|---|---|
| 2018/0019387 A1 | 1/2018 | Tan et al. |
| 2019/0013353 A1* | 1/2019 | Lee ..................... H01L 27/222 |
| 2019/0088861 A1* | 3/2019 | Murakami ............. H01L 43/10 |

* cited by examiner

US 10,714,683 B2

MULTILAYER HARDMASK FOR HIGH PERFORMANCE MRAM DEVICES

BACKGROUND

The present application relates to embedded high performance magnetoresistive random access memory (MRAM) devices, and more particularly to a multilayered hardmask for a MRAM device that prevents degradation of the performance of a magnetic tunnel junction (MTJ) structure of the MRAM device.

MRAM is a non-volatile random access memory technology in which data is stored by magnetic storage elements. These elements are typically formed from two ferromagnetic plates, each of which can hold a magnetization, separated by a thin dielectric layer. One of the two plates is a permanent magnetic set to a particular polarity; the other plate's magnetization can be changed to match that of an external field to store memory. Such a configuration is known as magnetic tunnel junction (MTJ).

In leading-edge or neuromorphic computing systems, a MTJ structure (or pillar) is typically embedded within a back-end-of-the-line (BEOL) structure and a metal hard mask is typically formed above a multilayered MTJ structure, and the metal hardmask is used as an etch mask to provide the MTJ structure. Halogen-based metal hardmask etching is typically used to provide an optimal MTJ structure profile. However, halogen diffusion into the metal hardmask degrades the magnetics of the MTJ structure. One current solution to this problem is to employ a thicker metal hardmask. However, such a solution does not mitigate the problem as future nodes need the MTJ structure height to scale. Thus, there is a need for providing a hardmask structure that can circumvent halogen ion diffusion into the MTJ structure, without negatively impacting scaling.

SUMMARY

Multilayered hardmask structures are provided which can prevent degradation of the performance of a magnetic tunnel junction (MTJ) structure. The multilayered hardmask structures include at least a halogen barrier hardmask layer and an upper hardmask layer. The halogen barrier hardmask layer can prevent halogen ions that are used to pattern the upper hardmask layer from diffusing into the MTJ structure.

In one aspect of the present application, a semiconductor structure is provided. In one embodiment, the semiconductor structure includes a first electrically conductive structure embedded in a first interconnect dielectric material layer and located in a magnetoresistive random access memory (MRAM) device area. A conductive landing pad is located on a surface of the first electrically conductive structure in the MRAM device area. A magnetic tunnel junction (MTJ) structure is located on the conductive landing pad, and a MTJ cap is located on the MTJ structure. The structure further includes a multilayered hardmask structure located on the MTJ cap. The multilayered hardmask structure includes a patterned halogen barrier hardmask layer and a patterned upper hardmask layer. A second interconnect dielectric material layer is located above the first interconnect dielectric material layer and surrounding the MTJ structure, the MTJ cap and the multilayered hardmask structure, wherein a second electrically conductive structure is embedded in the second interconnect dielectric material layer and is in contact with an upper portion of the patterned upper hardmask layer of the multilayered hardmask structure.

In another aspect of the present application, a method of forming a semiconductor structure is provided. In one embodiment, the method includes providing a first electrically conductive structure embedded in a first interconnect dielectric material layer and located in a magnetoresistive random access memory (MRAM) device area, wherein a conductive landing pad is located on a surface of the first electrically conductive structure. A multilayered magnetic tunnel junction (MTJ) structure and a MTJ cap layer are formed on the conductive landing pad, and thereafter a halogen barrier hardmask layer is formed over the MTJ cap layer. An upper hardmask layer is formed atop the halogen barrier hardmask layer. Next, the upper hardmask layer is patterned, utilizing a halogen-based etching process, to provide a patterned upper hardmask layer. The halogen barrier hardmask layer, the MTJ structure and the MTJ cap layer are then patterned utilizing ion beam etching and the patterned upper hardmask layer as an etch mask. Next, a second electrically conductive structure is formed in a second interconnect dielectric material layer and is in contact with an upper portion of the patterned upper hardmask layer.

In another embodiment, the method includes providing a first electrically conductive structure embedded in a first interconnect dielectric material layer and located in a magnetoresistive random access memory (MRAM) device area, wherein a conductive landing pad is located on a surface of the first electrically conductive structure. A multilayered magnetic tunnel junction (MTJ) structure and a MTJ cap layer are then formed on the conductive landing pad. Next, a halogen barrier hardmask layer is formed over the MTJ cap layer, and thereafter a patterned upper hardmask layer having a seam is formed atop the halogen barrier hardmask layer. The upper hardmask layer is then patterned, utilizing a halogen-based etching process, to provide a patterned upper hardmask layer. Next, the halogen barrier hardmask layer, the MTJ structure and the MTJ cap layer are patterned utilizing ion beam etching and the patterned upper hardmask layer as an etch mask. A second electrically conductive structure is then formed in a second interconnect dielectric material layer and is in contact with an upper portion of the patterned upper hardmask layer.

In yet another embodiment, the method includes providing a first electrically conductive structure embedded in a first interconnect dielectric material layer and located in a magnetoresistive random access memory (MRAM) device area, wherein a conductive landing pad is located on a surface of the first electrically conductive structure. A multilayered magnetic tunnel junction (MTJ) structure and a MTJ cap layer are then formed on the conductive landing pad, and thereafter, a hardmask layer is formed atop the MTJ cap layer. An optional dielectric patterning layer is then formed on the hardmask layer, and thereafter a timed etching process is employed to remove a portion of the hardmask layer utilizing the patterned optional patterning dielectric layer as an etch mask. Next, a reactive ion etching or an ion beam etching process is employed to remove the remaining portion of the hardmask layer, not protected by the patterned optional patterning dielectric layer, while stopping on the underlying MTJ cap layer.

DETAILED DESCRIPTION

Figure 1:
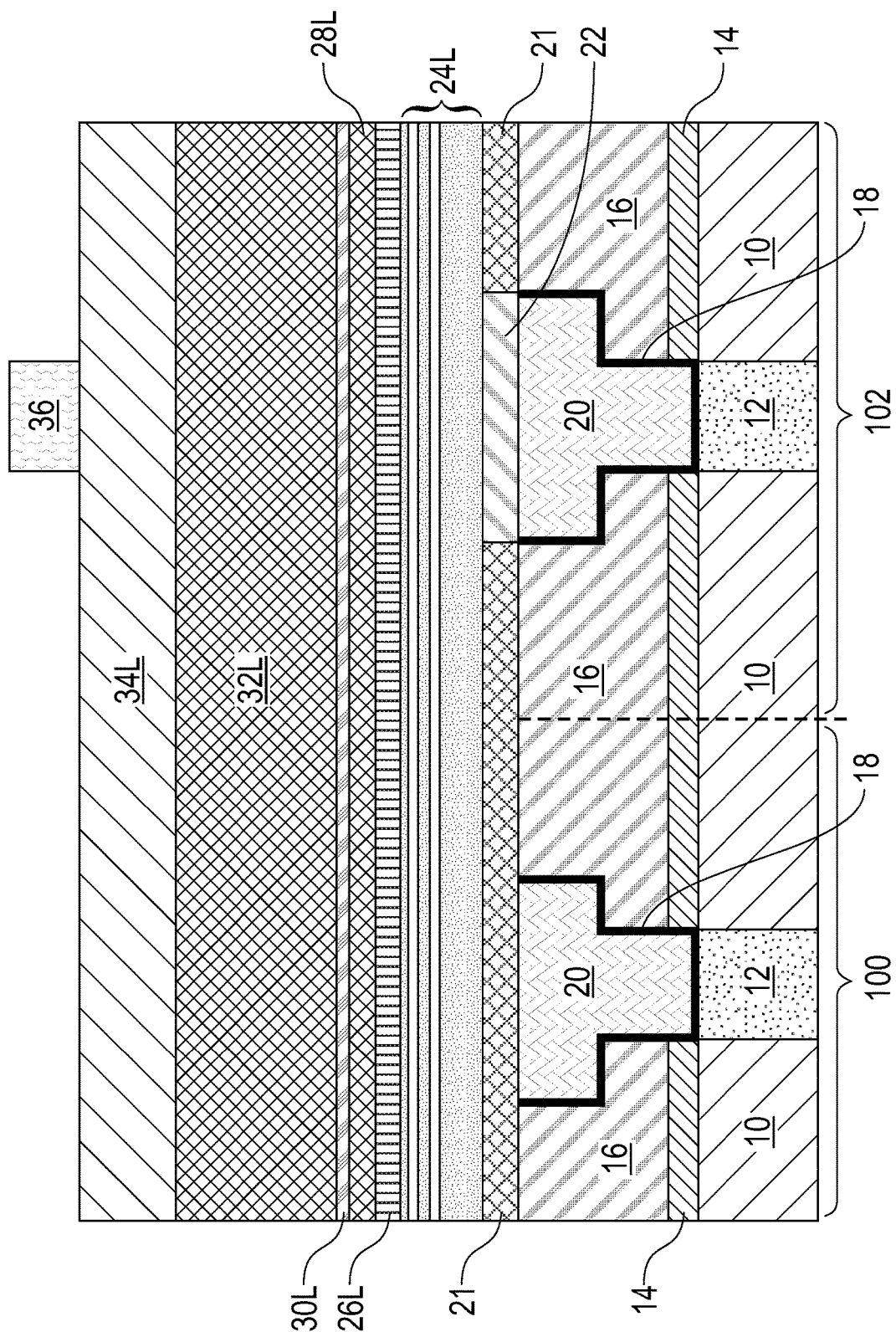
FIG. 1 is a cross sectional view of a first exemplary structure of the present application during an early stage of fabrication, and including a multilayered MTJ structure located above a lower interconnect level, a MTJ cap layer located on the multilayered MTJ structure, a halogen barrier hardmask layer located on the MTJ cap layer, an etch stop hardmask layer located on the halogen barrier hardmask layer, an upper hardmask layer located on the etch stop hardmask layer, an optional dielectric patterning layer located on the upper hardmask layer, and a patterned photoresist located on the optional patterning dielectric layer and positioned above a first electrically conductive structure present in a MRAM device area of the lower interconnect structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over"

another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a magnetic tunnel junction (MTJ) structure (i.e., pillar) for data storage, a bit line and a word line. In general, the MTJ's electrical resistance will be high or low based on the relative magnetic states of certain layers within the MTJ structure. Data is written to the MTJ structure by applying certain magnetic fields or charge currents to switch the magnetic states of the layers of the MTJ structure. Data is read by detecting the resistance of the MTJ structure. Using a magnetic state/characteristic for storage has two main benefits. First, unlike electric charge, magnetic state does not leak away with time, so the stored data remains even when system power is turned off. Second, switching magnetic states has no known wear-out mechanism. The term "magnetoresistance" describes the effect whereby a change to certain magnetic states of the MTJ structure results in a change to the MTJ resistance, hence the name "Magnetoresistive" RAM.

Referring first to FIG. 1, there is illustrated a first exemplary structure of the present application during an early stage of fabrication, and including a multilayered MTJ structure 24L located above a lower interconnect level, a MTJ cap layer 26L located on the multilayered MTJ structure 24L, a halogen barrier hardmask layer 28L located on the MTJ cap layer 26L, an etch stop hardmask layer 30L located on the halogen barrier hardmask layer 28L, an upper hardmask layer 32L located on the etch stop hardmask layer 30L, an optional dielectric patterning layer 34L located on the upper hardmask layer 32L, and a patterned photoresist 36 located on the optional patterning dielectric layer 34L and positioned above a first electrically conductive structure present in the MRAM device area 102 of the lower interconnect structure. The exemplary structure of FIG. 1 may also include a non-MRAM device area 100 located laterally adjacent to the MRAM device area 102. In some embodiments, the dielectric patterning layer 34L is not employed.

The lower interconnect structure includes a plurality of first electrically conductive structures 20 embedded in a first interconnect dielectric material layer 16. A first diffusion barrier liner 18 is typically present between each first electrically conductive structure 20 and the first interconnect dielectric material layer 16. In some embodiments and as depicted in FIG. 1, the lower interconnect level is positioned above a middle-of-the line (MOL) level that includes a MOL dielectric material layer 10 having contact structures 12 embedded therein. A dielectric capping layer 14 may be present between the first interconnect dielectric material layer 16 and the MOL dielectric material layer 10. The MOL level is located above a front-end-of-the-line (FEOL) level (not shown) in which a plurality of FEOL semiconductor devices such as, for example, transistors, capacitors and/or resistors are formed.

The MOL dielectric material layer 10 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In one embodiment, the MOL dielectric material layer 10 can be formed utilizing a deposition process including, for example, chemical vapor deposition (CVD), plasma enhanced chemical vapor deposition (PECVD), evaporation or spin-on coating.

Contact openings (not shown) are then formed into the MOL dielectric material layer 10 utilizing lithography and etching. The contacting openings are then filled with a contact metal or metal alloy such as, tungsten (W), cobalt (Co), platinum (Pt), nickel (Ni) or alloys thereof. The filling of the contact openings may include a deposition process such as, for example, chemical vapor deposition (CVD), plasma enhanced chemical vapor deposition (PECVD), atomic layer deposition (ALD), physical vapor deposition (PVD), sputtering, chemical solution deposition or plating. A planarization process may follow the filling of the contact openings. The contact metal or metal alloy within each opening is referred to herein as a contact structure 12. In accordance with the illustrated embodiment of FIG. 1, a contact structure 12 is present in the non-MRAM device area 100 and the MRAM device area 102.

Dielectric capping layer 14 may then be formed on the MOL level. The dielectric capping layer 14 may be composed of SiC, $Si_3N_4$, $SiO_2$, a carbon doped oxide, a nitrogen and hydrogen doped silicon carbide SiC(N,H) or multilayers thereof. The dielectric capping layer 14 can be formed utilizing a conventional deposition process such as, for example, CVD, PECVD, chemical solution deposition, evaporation, or ALD. The thickness of the dielectric capping layer 14 may vary depending on the technique used to form the same as well as the material make-up of the layer. In one example, the dielectric capping layer 14 may have a thickness from 15 nm to 100 nm. Other thicknesses that are lesser than 15 nm, or greater 100 nm may also be employed as the thickness of the dielectric capping layer 14. In some embodiments, the dielectric capping layer 14 may be omitted from the exemplary structure.

The first interconnect dielectric material layer 16 may include an inorganic dielectric material or an organic dielectric material. In one embodiment, the first interconnect dielectric material layer 16 may be non-porous. In another embodiment, the first interconnect dielectric material layer 16 may be porous. Some examples of suitable dielectric materials (i.e., interconnect dielectrics) that may be used as the first interconnect dielectric material layer 16 include, but are not limited to, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first interconnect dielectric material layer 16 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first interconnect dielectric material layer 16 may vary depending upon the type of dielectric material(s) used. In one example, the first interconnect dielectric material layer 16 may have a thickness from 50 nm to 1000 nm. Other thicknesses that are lesser than, or greater than, the aforementioned thickness range may also be employed in the present application for the thickness of the first interconnect dielectric material layer 16. The first interconnect dielectric material layer 16 may be formed utilizing any deposition process including, but not limited to, CVD, PECVD or spin-on coating.

The first interconnect dielectric material layer 16 is then processed to include a plurality of openings (not shown). A single opening and/or a plurality of openings can be formed into each of the non-MRAM device area 100 and the MRAM device area 102 of the first interconnect dielectric material layer 16. In the illustrated embodiment of FIG. 1, a single opening is formed into each of the non-MRAM device area 100 and the MRAM device area 102 of the first interconnect dielectric material layer 16. The openings, which are used to house, the first electrically conductive structures 20 may extend entirely through the first interconnect dielectric material layer 16. The openings may be via openings, line openings or combined via/line openings. The openings may be formed by lithography and etching. The etch used to form the openings may also open the underlying dielectric capping layer 14.

A diffusion barrier material layer is then formed into each opening and on the topmost surface of the first interconnect dielectric material layer 16. The diffusion barrier material layer includes a diffusion barrier material (i.e., a material that serves as a barrier to prevent a conductive material such as copper from diffusing there through) such as, for example, Ta, TaN, Ti, TiN, Ru, RuN, RuTa, RuTaN, W, or WN. In some embodiments, the diffusion barrier material layer may include a material stack of diffusion barrier materials. In one example, the diffusion barrier material layer may be composed of a stack of Ta/TaN. The thickness of the diffusion barrier material layer may vary depending on the deposition process used as well as the material employed. In some embodiments, the diffusion barrier material layer may have a thickness from 2 nm to 50 nm; although other thicknesses for the diffusion barrier material layer are contemplated and can be employed in the present application. The diffusion barrier material layer can be formed by a deposition process including, for example, CVD, PECVD, ALD, physical vapor deposition (PVD), sputtering, chemical solution deposition or plating.

An electrically conductive metal or metal alloy is formed into each opening and, is present, on the diffusion barrier material layer. Examples of electrically conductive metals that may be used in the present application include copper (Cu), aluminum (Al), or tungsten (W), while an example of an electrically conductive metal alloy is a Cu—Al alloy. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy.

Following the deposition of the electrically conductive metal or metal alloy, a planarization process such as, for example, chemical mechanical polishing (CMP) and/or grinding, can be used to remove the electrically conductive metal or metal alloy (i.e., overburden material) and the diffusion barrier material layer that is present outside each of the openings and from the topmost surface of the first interconnect dielectric material layer 16. The electrically conductive metal or metal alloy remaining in each opening is referred to herein as a first electrically conductive structure while the diffusion barrier material layer that remains in each opening is referred to herein as a first diffusion barrier liner 18. The planarization stops on a topmost surface of the first interconnect dielectric material layer 16. At this point of the present application, each first electrically conductive structure has a topmost surface that is coplanar with a topmost surface of the first interconnect dielectric material layer 16, as well as, the topmost surfaces of the diffusion barrier liner 14. As is shown, a diffusion barrier liner 18 is located between the first electrically conductive structures 20 and interconnect dielectric material layer 18. In some embodiments (not specifically shown), the diffusion barrier liner 18 may be omitted from the exemplary structure.

A dielectric capping layer 21 can be formed upon the lower interconnect level. In some embodiments, dielectric capping layer 21 may be omitted. The dielectric capping layer 21 may include one of the dielectric capping materials mentioned above for dielectric capping layer 14. The dielectric capping layer 21 can be formed utilizing one of the deposition techniques mentioned above for forming dielectric capping layer 14. The dielectric capping layer 21 can have a thickness within the thickness range mentioned above for dielectric capping layer 14. In some embodiments, the dielectric capping layer 21 is formed first and thereafter a conductive landing pad 22 is formed within an opening provided in the dielectric capping layer 21. In other embodiments, the conductive landing pad 22 is formed prior to the dielectric capping layer 21 and then the dielectric capping layer 21 is formed. In such an embodiment, an etch back process may be employed. In yet other embodiments, no dielectric capping layer 21 is formed.

In any of the embodiments, conductive landing pad 22 is formed upon a surface of first electrically conductive structure 20 in the MRM device area 102. The surface of the first electrically conductive structure 20 in which the landing pad 22 is formed upon may be a non-recessed surface or a recessed surface. The conductive landing pad 22 may be composed of Ta, TaN, Ti, TiN, Ru, RuN, RuTa, RuTaN, Co, CoWP, CoN, W, WN or any combination thereof. The conductive landing pad 22 may have a thickness from 2 nm to 25 nm; other thicknesses are possible and can be used in the present application as the thickness of the conductive landing pad 22. The conductive landing pad 22 may be formed by a deposition process such as, for example, sputtering, ALD, CVD or PVD. An etch back process, a planarization process (such as, for example, chemical mechanical polishing), or a patterning process (such as, for example, lithography and etching) may follow the deposition of the conductive material that provides the conductive landing pad 22. In some embodiments and as illustrated in FIG. 1, the conductive landing pad 22 has a topmost surface that is coplanar with a topmost surface of the dielectric capping layer 21. In other embodiments (not shown), the conductive landing pad 22 has a topmost surface that is above, or below, the topmost surface of the dielectric capping layer 21.

As stated above, a multilayered MTJ structure 24L is located above the lower interconnect level. The multilayered MTJ structure 24L can be formed by utilizing one or more deposition processes such as, for example, CVD, PECVD, PVD, or sputtering. The multilayered MTJ structure 24L may include a stack, from bottom to top, of a reference layer, a tunnel barrier, and a free layer. The reference layer has a fixed magnetization. The reference layer of the multilayered MTJ structure 24L may be composed of a metal or metal alloy that includes one or more metals exhibiting high spin polarization. In alternative embodiments, exemplary metals for the formation of the reference layer include iron, nickel, cobalt, chromium, boron, or manganese. Exemplary metal alloys may include the metals exemplified by the above. In another embodiment, the reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the multilayered MTJ structure 24L is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The free layer of the multilayered MTJ structure 24L is composed of a magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

After providing the multilayered MTJ structure 24L, the MTJ cap layer 26L is formed on the multilayered MTJ structure 24L. The MTJ cap layer 26L may be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer 26L may be formed utilizing a deposition process including, for example, CVD, PECVD, ALD, PVD, sputtering, chemical solution deposition or plating. The MTJ cap layer 26 may have a thickness from 2 nm to 25 nm; other thicknesses are possible and can be used in the present application as the thickness of the MTJ cap layer 26L.

After providing the MTJ cap layer 26L, the halogen barrier hardmask layer 28L is formed on the MTJ cap layer 26L. The halogen barrier hardmask layer 28L may be composed of Nb, NbN, W, WN, Ta, TaN, Ti, TiN, Ru, Mo, Cr, V, Pd, Pt, Rh, Sc, Al or other high melting point metals or conductive metal nitrides, with the proviso that the material that provides the halogen barrier hardmask layer 28L is more resistant to halogen diffusion than is the material that provides the MTJ cap layer 26L. The halogen barrier hardmask layer 28L may be formed utilizing a deposition process including, for example, CVD, PECVD, ALD, PVD, sputtering, chemical solution deposition or plating. The halogen barrier hardmask layer 28L may have a thickness from 2 nm to 25 nm; other thicknesses are possible and can be used in the present application as the thickness of the halogen barrier hardmask layer 28L.

After providing the halogen barrier hardmask layer 28L, the etch stop hardmask layer 30L is formed on the halogen barrier hardmask layer 28L. The etch stop hardmask layer 30L is composed of material that is less resistant to halogen diffusion than is the material that provides the halogen barrier hardmask layer 28L. Exemplary materials for the etch stop hardmask layer 30L include Nb, NbN, W, WN, Ru, Mo, Cr, V, Pd, Pt, Rh, Sc, Al or other conductive materials exhibiting low etch rates with a halogen-based etchant. The etch stop hardmask layer 30L may be formed utilizing a deposition process including, for example, CVD, PECVD, ALD, PVD, sputtering, chemical solution deposition or plating. The etch stop hardmask layer 30L may have a thickness from 2 nm to 25 nm; other thicknesses are possible and can be used in the present application as the thickness of the etch stop hardmask layer 30L.

After providing the etch stop hardmask layer 30L, an upper hardmask layer 32L is formed on the etch stop hardmask layer 30L. The upper hardmask layer 32L is composed of material that is compositionally different from the material that provides the etch stop hardmask layer 30L and the material that provides the halogen barrier hardmask layer 28L. Exemplary materials for the upper hardmask layer 32L include Nb, NbN, W, WN, Ta, TaN, Ti, TiN, Ru, Mo, Cr, V, Pd, Pt, Rh, Sc, Al or other high melting point metals or conductive metal nitrides The upper hardmask layer 32L may be formed utilizing a deposition process including, for example, CVD, PECVD, ALD, PVD, sputtering, chemical solution deposition or plating. The upper hardmask layer 32L may have a thickness from 10 nm to 100 nm; other thicknesses are possible and can be used in the present application as the thickness of the upper hardmask layer 32L.

After forming the upper hardmask layer 32L, the optional patterning dielectric layer 34L is formed on the upper hardmask layer 32L. The optional patterning dielectric layer 34L can be formed utilizing a deposition process such as, for example, CVD, PECVD or spin-coating. The optional patterning dielectric layer 34L may have a thickness from 5 nm to 200 nm; other thicknesses are possible and can be used in the present application as the thickness of the optional dielectric patterning layer 34L.

Patterned photoresist 36 is then formed above the first electrically conductive structure 20 present in the MRAM device area 102 of the lower interconnect structure. The patterned photoresist 36 may be composed of a conventional photoresist material and it may formed by deposition of a layer of the photoresist material and photolithography. In some embodiments, and as is illustrated, the patterned photoresist 26 is formed on the optional patterning dielectric layer 34L.

Figure 2:
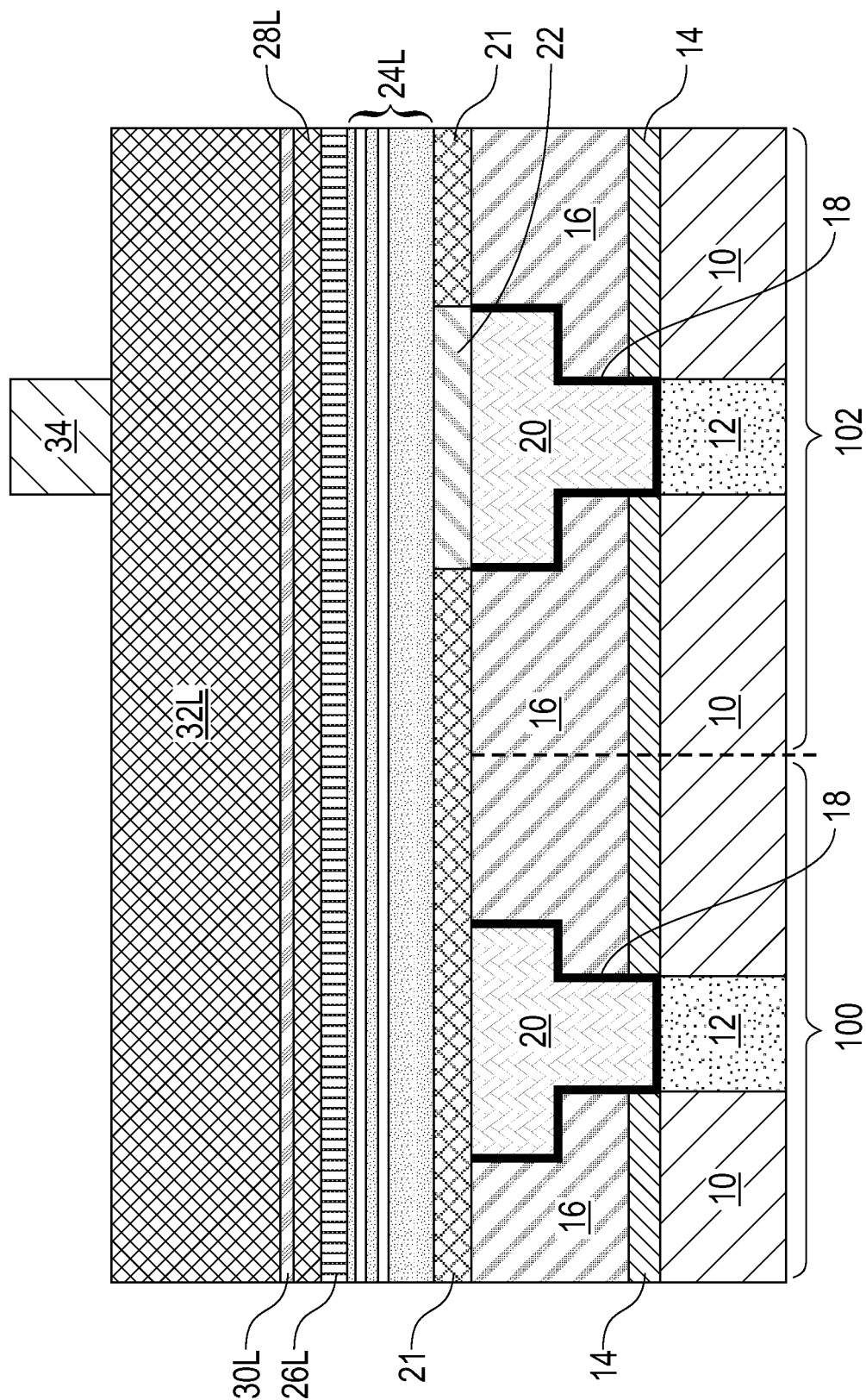
FIG. 2 is a cross sectional view of the first exemplary structure of FIG. 1 after patterning the optional patterning dielectric layer and removing the patterned photoresist.

Referring now to FIG. 2, there is illustrated the first exemplary structure of FIG. 1 after patterning the optional patterning dielectric layer 34L and removing the patterned photoresist 36. In embodiments in which the optional patterning dielectric layer 34L is not used, this patterning step may be omitted. The patterning of the optional patterning dielectric layer 34L may be performed utilizing an anisotropic etching process that is selective in removing the physically exposed portions of the optional patterning dielectric layer 34L that are not protected by the patterned photoresist 36. In one example, a reactive ion etch may be used in removing the physically exposed portions of the optional patterning dielectric layer 34L that are not protected by the patterned photoresist 36. The portion of the optional patterning dielectric layer 34L that remains beneath the patterned photoresist 36 may be referred to herein as a patterned optional patterning dielectric layer 34. The patterned optional patterning dielectric layer 34 is positioned above the first electrically conductive structure 20 present in the MRAM device area 102 of the lower interconnect structure. The patterned photoresist 36 can be removed utilizing a stripping process such as, for example, ashing.

Figure 3:
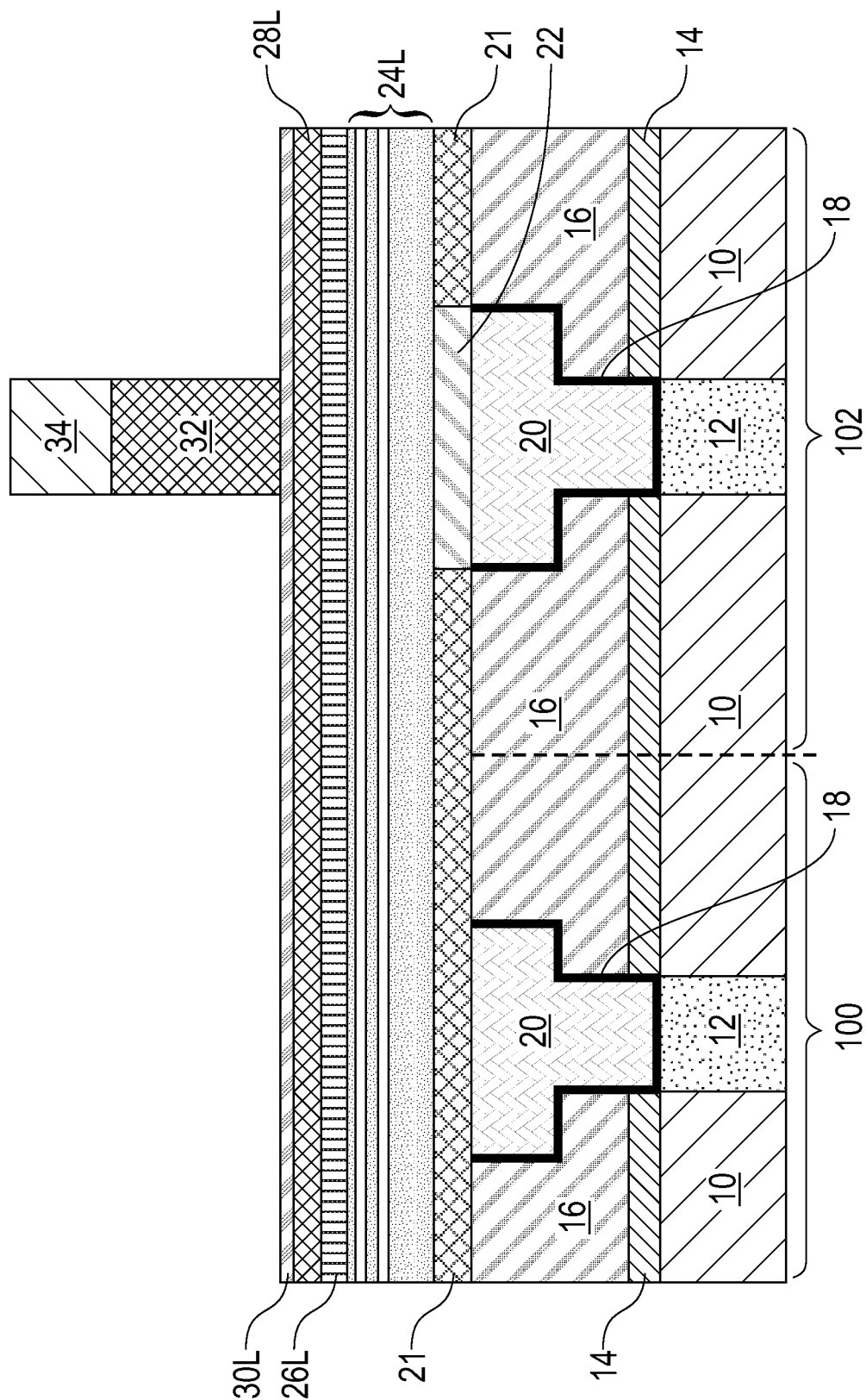
FIG. 3 is a cross sectional view of the first exemplary structure of FIG. 2 after patterning the upper hardmask layer utilizing a halogen-based reactive ion etching process.

Referring now to FIG. 3, there is illustrated the first exemplary structure of FIG. 2 after patterning the upper hardmask layer 32L utilizing a halogen-based reactive ion etching process; the patterned optional patterning dielectric layer 34 is employed as an etch mask. In some embodiments, and when no patterning dielectric layer 34L is employed, the photoresist 36 may be used as the etch mask during this step of the present application. The remaining upper hardmask layer 32L may be referred to herein as patterned upper hardmask layer 32. Due to the presence of the halogen barrier hardmask layer 28L, halogen ions that are used during this etch step are prevented from diffusing into the MTJ cap layer 26L and the underlying multilayered MTJ structure 24L.

Figure 4:
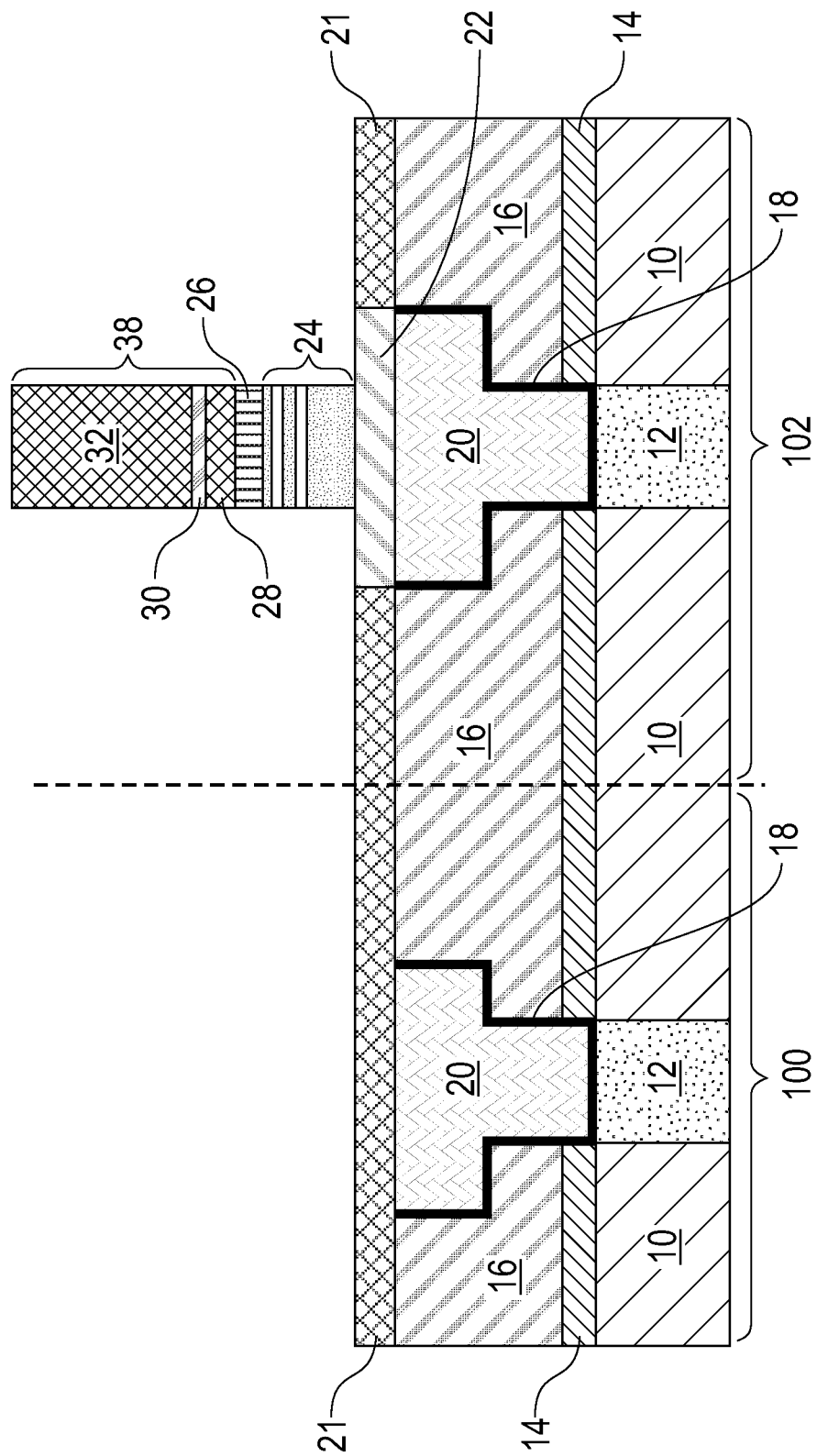
FIG. 4 is a cross sectional view of the first exemplary structure of FIG. 3 after patterning the etch stop hardmask layer, the halogen barrier hardmask layer, the MTJ cap layer and the multilayered MTJ structure utilizing ion beam etching, and removing the patterned optional patterning dielectric layer.

Referring now to FIG. 4, there is illustrated the first exemplary structure of FIG. 3 after patterning the etch stop hardmask layer 30L, the halogen barrier hardmask layer 28L, the MTJ cap layer 26 and the multilayered MTJ structure 24L utilizing ion beam etching, and removing the patterned optional patterning dielectric layer 34 utilizing a conventional stripping process. In the ion beam etching step, the patterned optional patterning dielectric layer 34 and the patterned upper hardmask layer 32 serve as a combined etch mask.

The remaining etch stop hardmask layer 30L that is positioned beneath the patterned optional patterning dielectric layer 34 and the patterned upper hardmask layer 32 may be referred to herein as a patterned etch stop hardmask layer 30, the remaining halogen barrier hardmask layer 28L that is positioned beneath the patterned optional patterning dielectric layer 34 and the patterned upper hardmask layer 32 may be referred to herein as a patterned halogen barrier hardmask layer 28, the remaining MTJ cap layer 26 that is positioned beneath the patterned optional patterning dielectric layer 34 and the patterned upper hardmask layer 32 may be referred to herein as a MTJ cap 26, while the remaining multilayered MTJ structure 24L that is positioned beneath the patterned optional patterning dielectric layer 34 and the patterned upper hardmask layer 32 may be referred to herein as a MTJ structure 24. Collectively, the patterned upper hardmask layer 32, the patterned etch stop hardmask layer 30, and the patterned halogen barrier hardmask layer 28 provide a multilayered hardmask structure 38 that is located on the MTJ cap 26 which is positioned atop the MTJ structure 24.

As is shown, the multilayered hardmask structure 38 has outermost sidewalls that are vertically aligned to the outermost sidewalls of the MTJ cap 26 and the underlying MTJ structure 24. As is further shown, this pillar of the multilayered hardmask structure 38, MTJ cap 26 and MTJ structure 24 is positioned on the landing pad 22 that is present in the MRAM device area 102 of the exemplary structure. The pillar of the multilayered hardmask structure 38, the MTJ cap 26 and MTJ structure 24, when looking from a top down view, typically is circular in shape.

Figure 5:
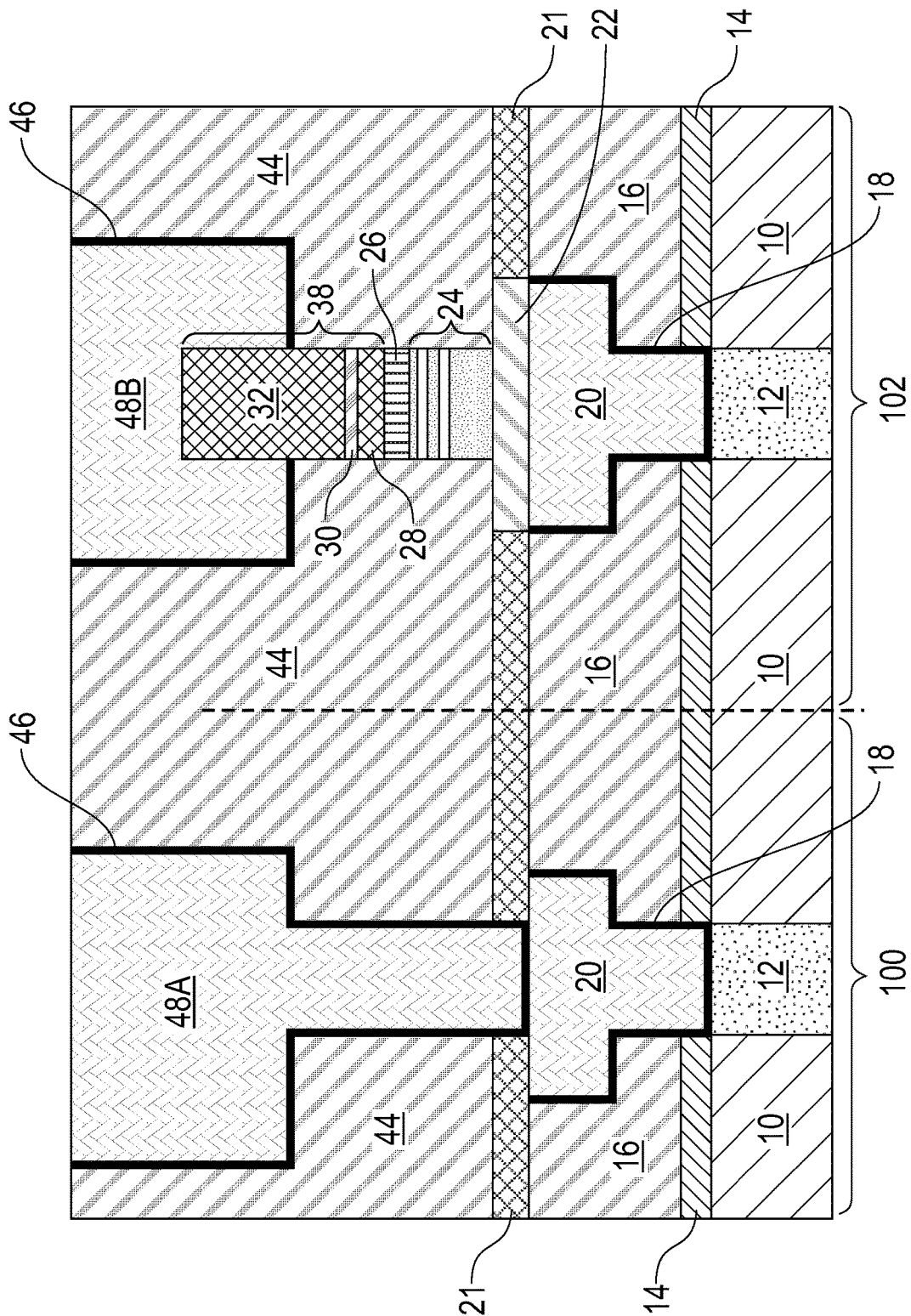
FIG. 5 is a cross sectional view of the first exemplary structure of FIG. 4 after forming an upper interconnect level including a second electrically conductive structure contacting the patterned upper hardmask layer.

Referring now to FIG. 5, there is illustrated the first exemplary structure of FIG. 4 after forming an upper interconnect level including a second electrically conductive structure 48B contacting the patterned upper hard mask layer 32. The upper interconnect level may also include another second electrically conductive structure 48A that contacts a first electrically conductive structure 20 that is located in the first interconnect dielectric material layer 16 and within the non-MRAM device area 100.

The upper interconnect level can be formed by first providing a second interconnect dielectric material layer 44 within the non-MRAM device area 100 and the MRAM device area 102. The second interconnect dielectric material layer 44 may include one of the interconnect dielectric materials mentioned above for the first interconnect dielectric material layer 16. In one embodiment, the second interconnect dielectric material layer 44 is composed of a same interconnect dielectric material as the first interconnect dielectric material layer 14. In other embodiment, the second interconnect dielectric material layer 44 is composed of a different interconnect dielectric material than the first interconnect dielectric material layer 16. The second interconnect dielectric material layer 44 may be formed utilizing one of the deposition processes mentioned above in forming the first interconnect dielectric material layer 16. The second interconnect dielectric material layer 44 may have a thickness within the thickness range mentioned above for the first interconnect dielectric material layer 16 with the proviso that the second interconnect dielectric material layer 44 has a thickness that is greater than the total height of the multilayered hardmask cap 38.

After forming the second interconnect dielectric material layer 44, contact openings can be formed therein by lithography and etching. Next, a diffusion barrier material layer, as defined above, is then formed into each opening and on the topmost surface of the second interconnect dielectric material layer 44, and thereafter an electrically conductive metal or metal alloy, as defined above, is formed into each opening and, is present on the diffusion barrier material layer. A planarization process is then employed to remove the diffusion barrier material layer and the electrically conductive metal or metal alloy that is present outside of the contact openings. The remaining diffusion barrier material layer within the contact openings formed into the second interconnect dielectric material layer 44 may be referred to as a second diffusion barrier liner 46, while the remaining electrically conductive metal or metal alloy within the contact openings formed into the second interconnect dielectric material layer 44 may be referred to as a second electrically conductive structure 48A, 48B. In some embodiments, the formation of the second diffusion barrier liner 46 may be omitted.

Figure 6:
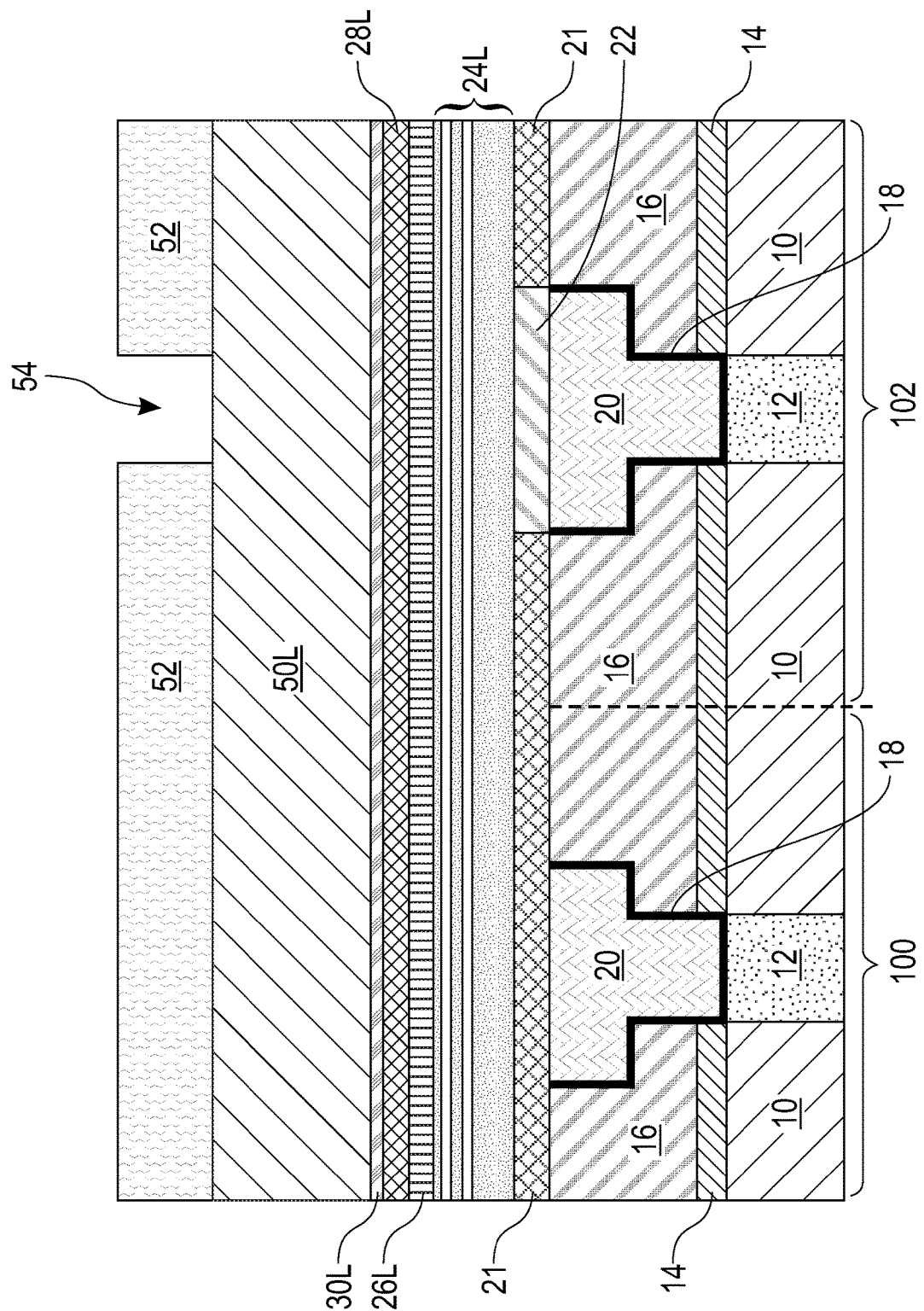
FIG. 6 is a cross sectional view of a second exemplary structure of the present application during an early stage of fabrication, and including a multilayered MTJ structure located above a lower interconnect level, a MTJ cap layer located on the multilayered MTJ structure, a halogen barrier hardmask layer located on the MTJ cap layer, an etch stop hardmask layer located on the halogen barrier hardmask layer, an oxide layer located on the etch stop hardmask layer and a patterned photoresist located on the oxide layer and having an opening positioned above a first electrically conductive structure present in a MRAM device area of the lower interconnect structure.

Referring now to FIG. 6, there is illustrated a second exemplary structure of the present application during an early stage of fabrication, and including a multilayered MTJ structure 24L located above a lower interconnect level, a MTJ cap layer 26L located on the multilayered MTJ structure 24L, a halogen barrier hardmask layer 28L located on the MTJ cap layer 26L, an etch stop hardmask layer 30L located on the halogen barrier hardmask layer 28L, an oxide layer 50L located on the etch stop hardmask layer 30L and a patterned photoresist 52 located on the oxide layer 50L and having an opening 54 positioned above a first electrically conductive structure 20 present in a MRAM device area 102 of the lower interconnect structure.

The exemplary structure of FIG. 6 also includes a MOL level containing a MOL dielectric material layer 10 having contact structures 12 embedded therein. The MOL dielectric material layer 10 and contact structures 12 of MOL level shown in FIG. 6 are the same as described above for the MOL level shown in FIG. 1. A dielectric capping layer 14, as defined above, may be present between the MOL level and the lower interconnect level.

The lower interconnect level of this embodiment includes a first interconnect dielectric material layer 16, as defined above, a first diffusion barrier liner 18, as defined above, and first electrically conductive structures 20 as defined above. The exemplary structure of FIG. 6 may also include a dielectric capping layer 21, as defined above, and a conductive landing pad 22, as defined above.

The multilayered MTJ structure 24L, the MTJ cap layer 26L, the halogen barrier hardmask layer 28L, and the etch stop hardmask layer 30L that are employed in this embodiment of the present application are the same as defined above for the embodiment depicted in FIG. 1 of the present application.

After providing the etch stop hardmask layer 30L, oxide hard mask layer 50L is formed on the etch stop hardmask layer 30L. The oxide layer 50L is composed of a low quality oxide that has a high wet etch rate. By "high wet etch rate" it is meant that the oxide has an etch rate of 2 Å/s or greater in dilute HF. The oxide layer 50L can be formed utilizing a deposition process such as, for example, CVD, PECVD or spin-coating. The oxide layer 50L may have a thickness from 50 nm to 200 nm; other thicknesses are possible and can be used in the present application as the thickness of the oxide layer 50L.

Patterned photoresist 52 can include any conventional photoresist material and it can be formed by deposition of the photoresist material followed by patterning of the photoresist material by photolithography.

Figure 7:
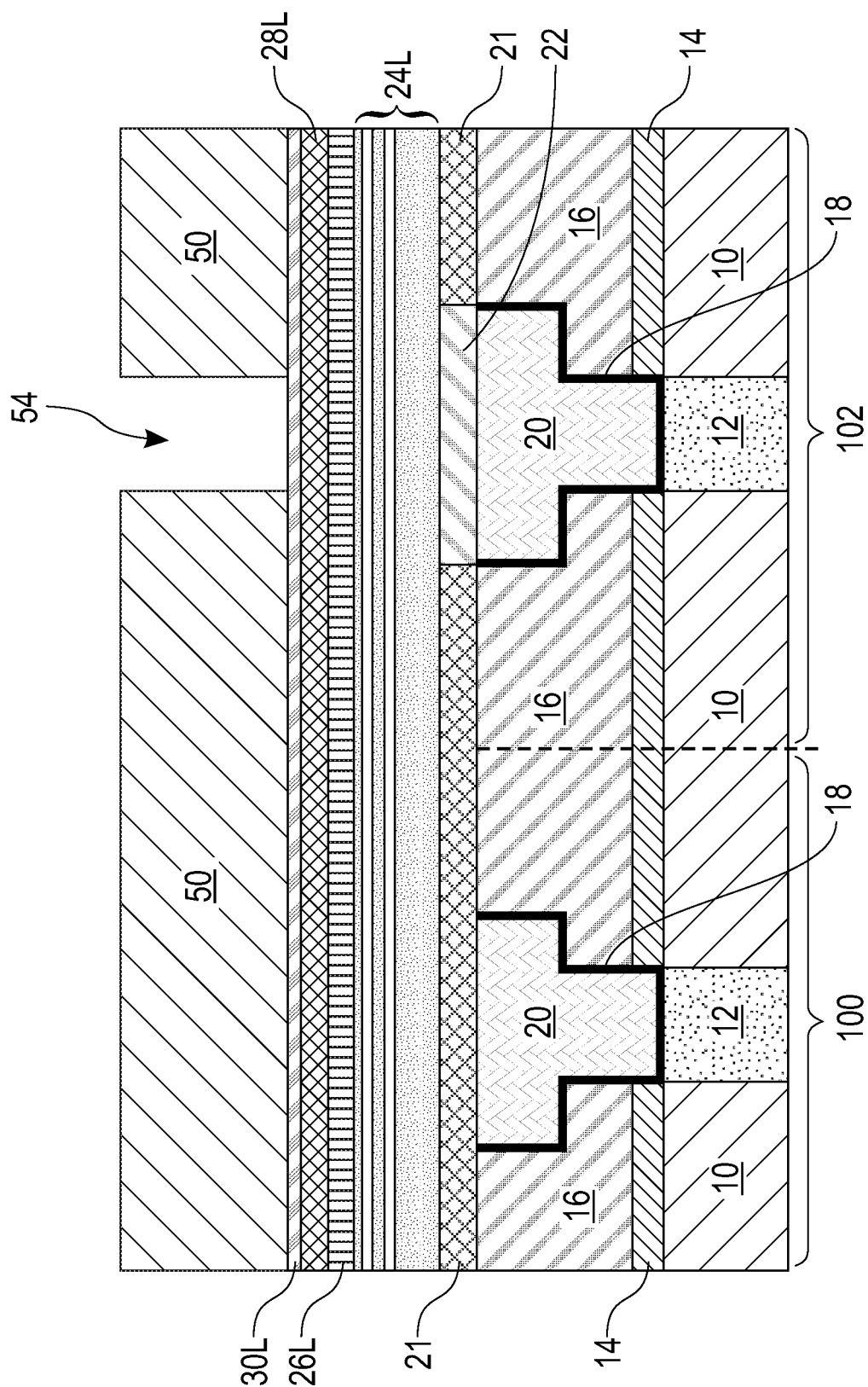
FIG. 7 is a cross sectional view of the second exemplary structure of FIG. 6 after transferring the opening into the oxide layer and removing the patterned photoresist.

Referring now to FIG. 7, there is illustrated of the second exemplary structure of FIG. 6 after transferring the opening 54 into the oxide layer 50L and removing the patterned photoresist 52. The transferring of the opening 54 into the oxide layer 50L may be performed utilizing an anisotropic etching process that is selective in removing the physically exposed portion of the oxide layer 50L that is not protected by the patterned photoresist 52. In one example, a reactive ion etch may be used in removing the physically exposed portion of the oxide layer 50L that is not protected by the patterned photoresist 52. The remaining oxide layer 50L that is located beneath the beneath the patterned photoresist 52 may be referred to herein as a patterned oxide layer 50. The patterned oxide layer 50 has an opening 54 that is positioned above the first electrically conductive structure 20 present in the MRAM device area 102 of the lower interconnect structure. The patterned photoresist 52 can be removed utilizing a striping process such as, for example, ashing.

Figure 8:
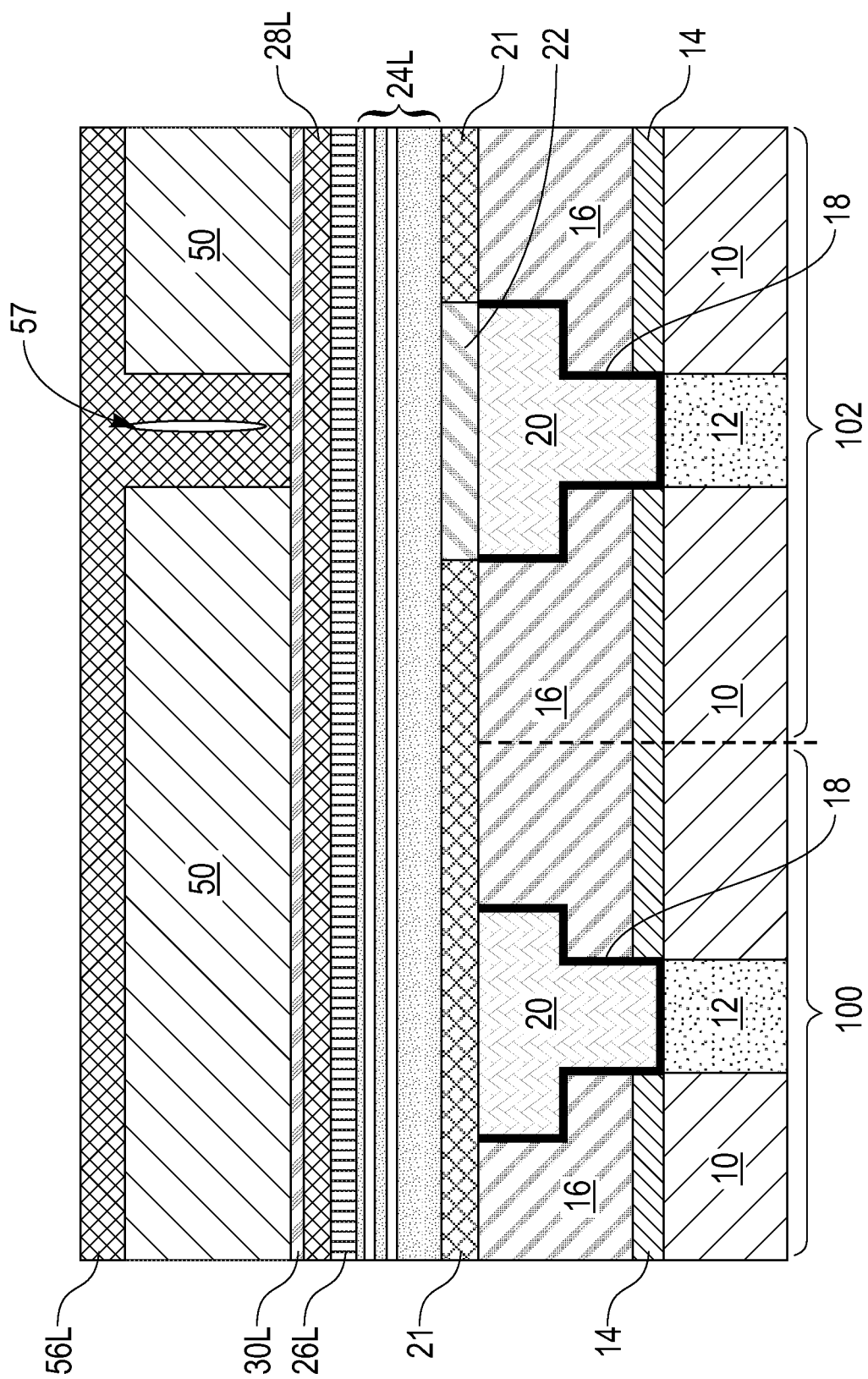
FIG. 8 is a cross sectional view of the second exemplary structure of FIG. 7 after forming an upper hardmask layer on the physically exposed topmost surface of the patterned oxide layer and within the opening, wherein a seam is present in the upper hardmask layer that is present in the opening.

Referring now to FIG. 8, there is illustrated the second exemplary structure of FIG. 7 after forming an upper hardmask layer 56L on the physically exposed topmost surface of the patterned oxide layer 50 and within the opening 54, wherein a seam 57 is present in the upper hardmask layer 56L that is present in the opening 54.

The upper hardmask layer 56L is composed of material that is compositionally different from the material that provides the etch stop hardmask layer 30L. Exemplary materials for the upper hardmask layer 56L include Nb, NbN, W, WN, Ta, TaN, Ti, TiN, Ru, Mo, Cr, V, Pd, Pt, Rh, Sc, Al or other high melting point metals or conductive metal nitrides. The upper hardmask layer 56L may be formed by may be formed utilizing a deposition process such as, for example, PVD.

Figure 9:
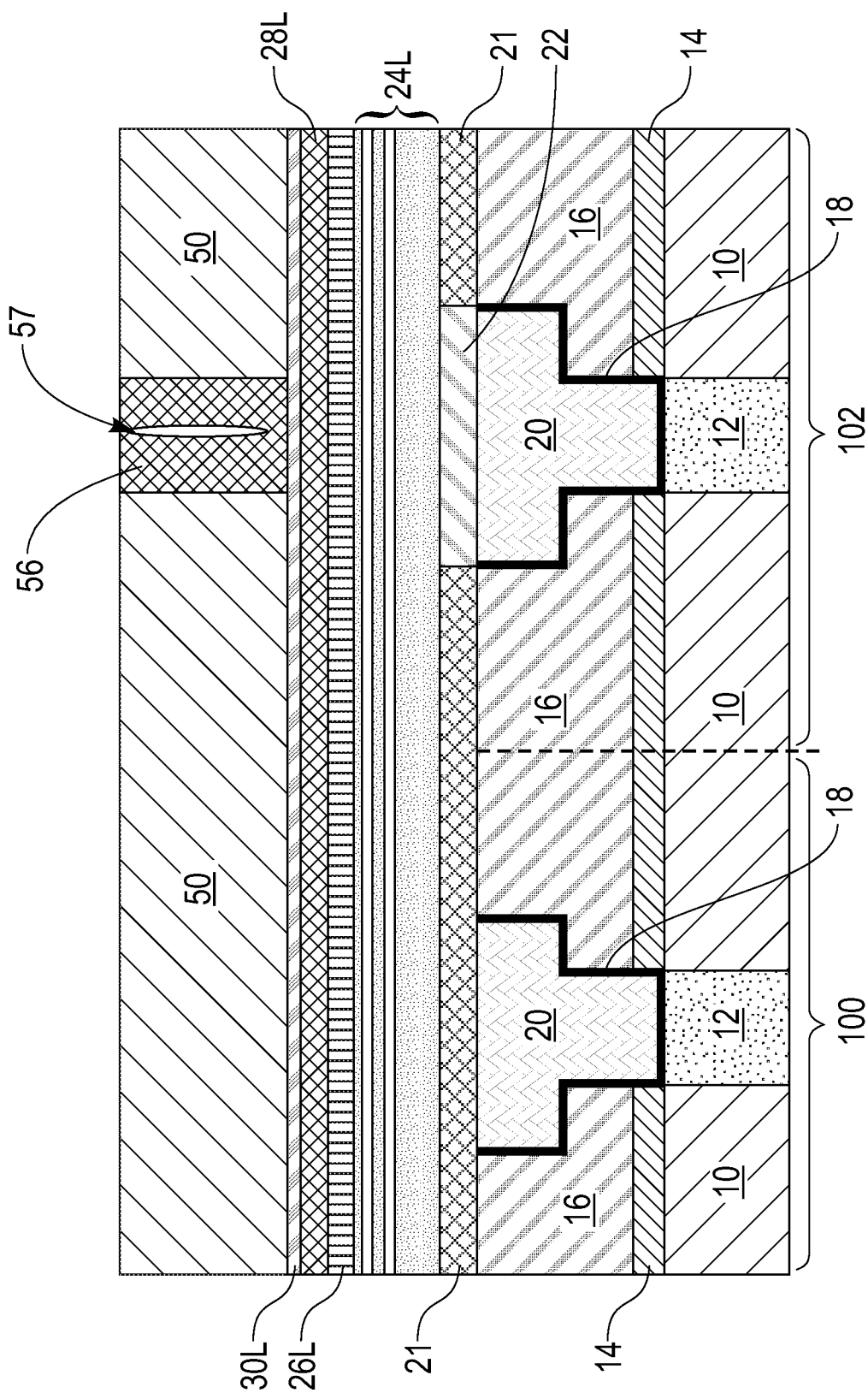
FIG. 9 is a cross sectional view of the second exemplary structure of FIG. 8 after performing a planarization process to remove the upper hardmask layer that is present on the topmost surface of the patterned oxide layer, while maintaining the upper hardmask layer having the seam in the opening.

Referring now to FIG. 9, there is illustrated the second exemplary structure of FIG. 8 after performing a planarization process such as, for example, chemical mechanical polishing and/or grinding, to remove the upper hardmask layer 56L that is present on the topmost surface of the patterned oxide layer 50, while maintaining the upper hardmask layer 56L having the seam 57 in the opening 54. The maintained upper hardmask layer 56L may be referred to herein as a patterned upper hardmask layer 56. The patterned upper hardmask layer 56 has a topmost surface that is coplanar with a topmost surface of the patterned oxide layer 50.

Figure 10:
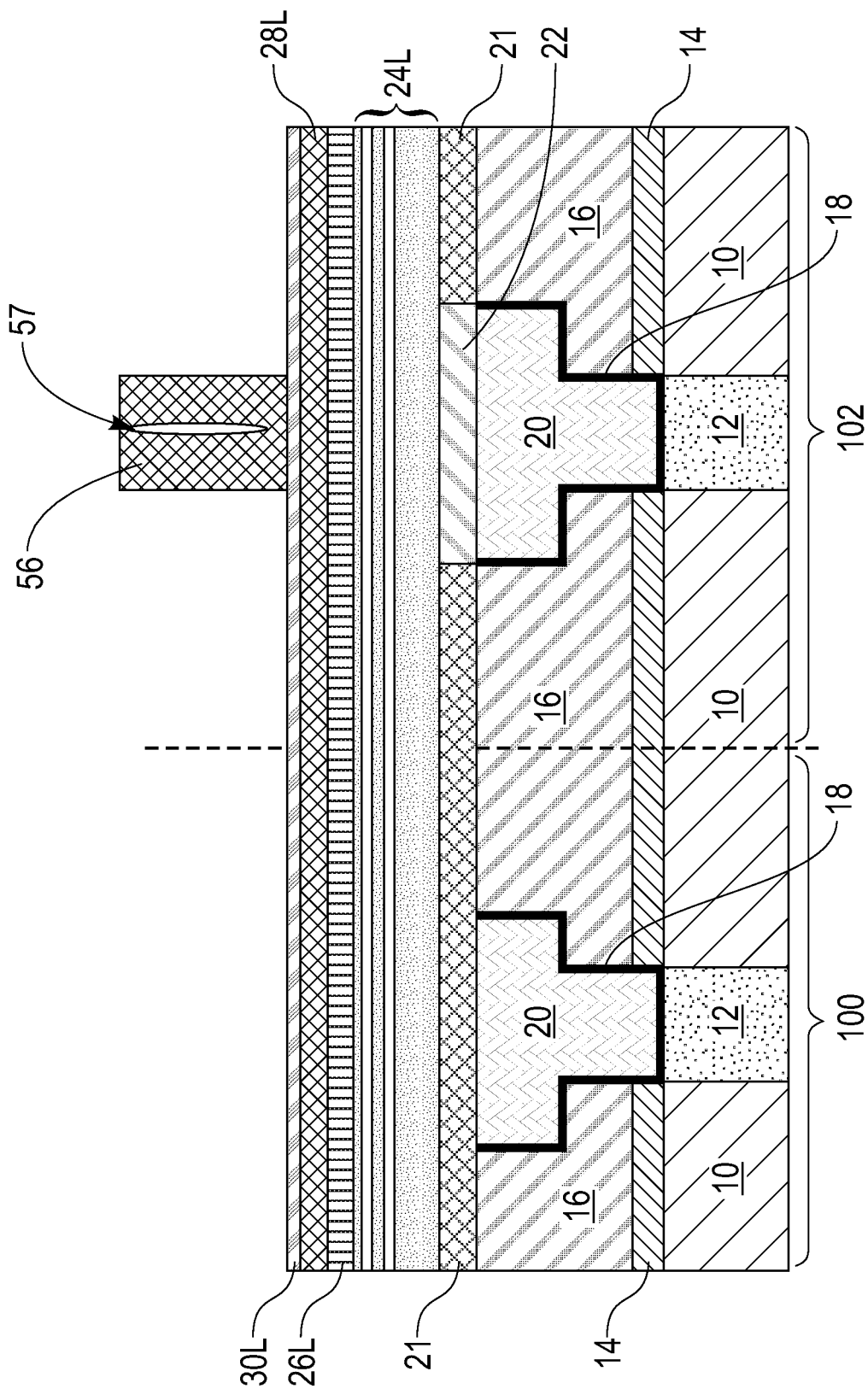
FIG. 10 is a cross sectional view of the second exemplary structure of FIG. 9 after removing the patterned oxide layer.

Referring now to FIG. 10, there is illustrated the second exemplary structure of FIG. 9 after removing the patterned oxide layer 50. The patterned oxide layer 50 may be removed utilizing a wet etching process that is selective removing the patterned oxide layer 50. In one example, dilute hydrofluoric acid may be used to remove the patterned oxide layer 50 from the exemplary structure.

Figure 11:
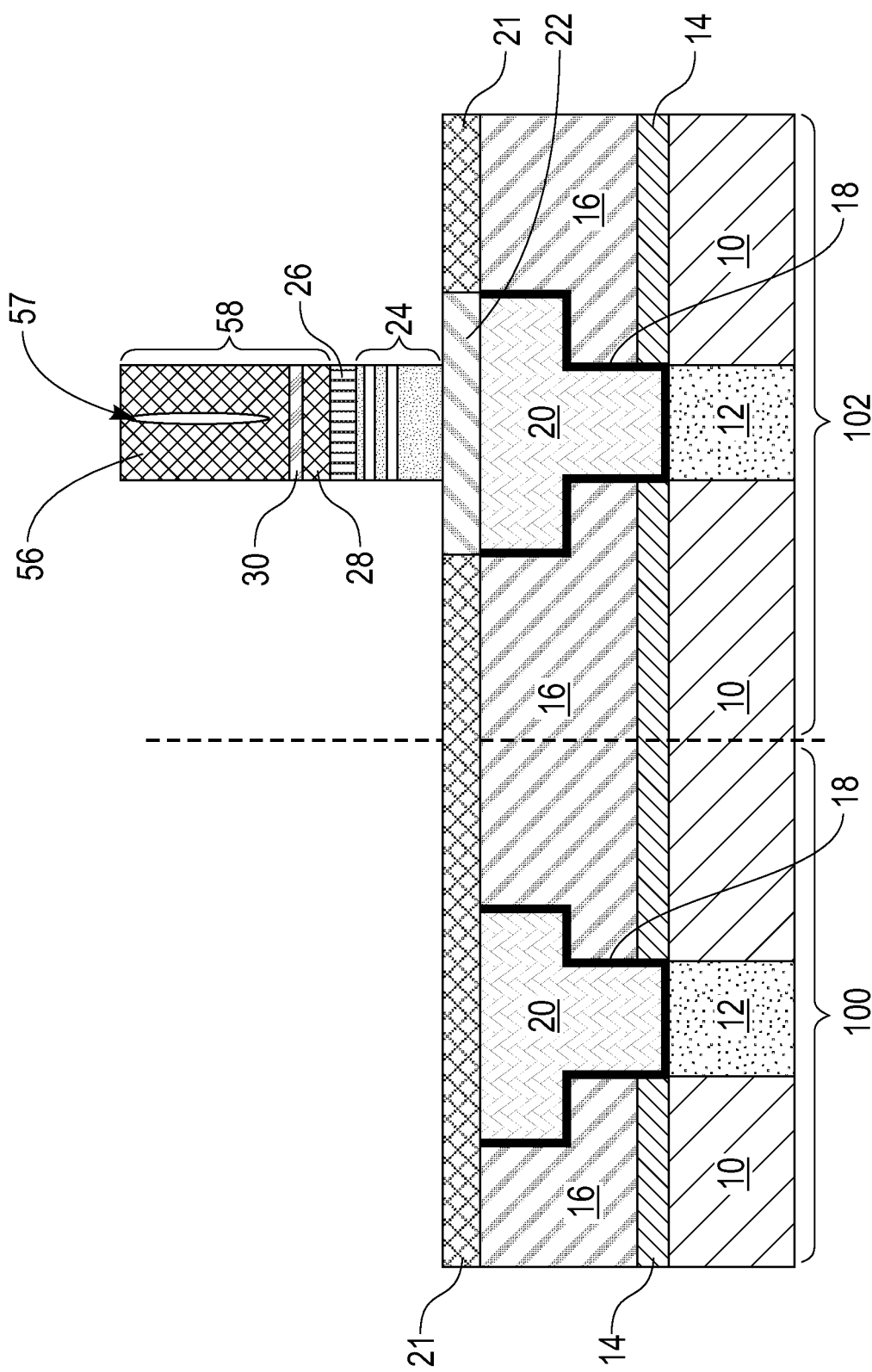
FIG. 11 is a cross sectional view of the second exemplary structure of FIG. 10 after patterning the etch stop hardmask layer, the halogen barrier hardmask layer, the MTJ cap layer and the multilayered MTJ structure utilizing ion beam etching and the remaining upper hardmask layer as an etch mask.

Referring now to FIG. 11, there is illustrated the second exemplary structure of FIG. 10 after patterning the etch stop hardmask layer 30L, the halogen barrier hardmask layer 28L, the MTJ cap layer 26L and the multilayered MTJ structure 24L utilizing ion beam etching and the remaining upper hardmask layer (i.e., the patterned upper hardmask layer 56) as an etch mask.

The remaining etch stop hardmask layer 30L that is positioned beneath the patterned upper hardmask layer 56 may be referred to herein as a patterned etch stop hardmask layer 30, the remaining halogen barrier hardmask layer 28L that is positioned beneath the patterned upper hardmask layer 56 may be referred to herein as a patterned halogen barrier hardmask layer 28, the remaining MTJ cap layer 26 that is positioned beneath the patterned upper hardmask layer 56 may be referred to herein as a MTJ cap 26, while the remaining multilayered MTJ structure 24L that is positioned beneath the patterned upper hardmask layer 56 may be referred to herein as a MTJ structure 24. Collectively, the patterned upper hardmask layer 56 having seam 57, patterned etch stop hardmask layer 30, and the patterned halogen barrier hardmask layer 28 provide a multilayered hardmask structure 58 that is located on the MTJ cap 26 which is positioned atop the MTJ structure 24.

As is shown, the multilayered hardmask structure 58 has outermost sidewalls that are vertically aligned to the outermost sidewalls of the MTJ cap 26 and the underlying MTJ structure 24. As is further shown, this pillar of the multilayered hardmask structure 58, MTJ cap 26 and MTJ structure 24 is positioned on the landing pad 22 that is present in the MRAM device area of the exemplary structure. The pillar of the multilayered hardmask structure 58, the MTJ cap 26 and MTJ structure 24, when looking from a top down view, typically is circular in shape.

Figure 12:
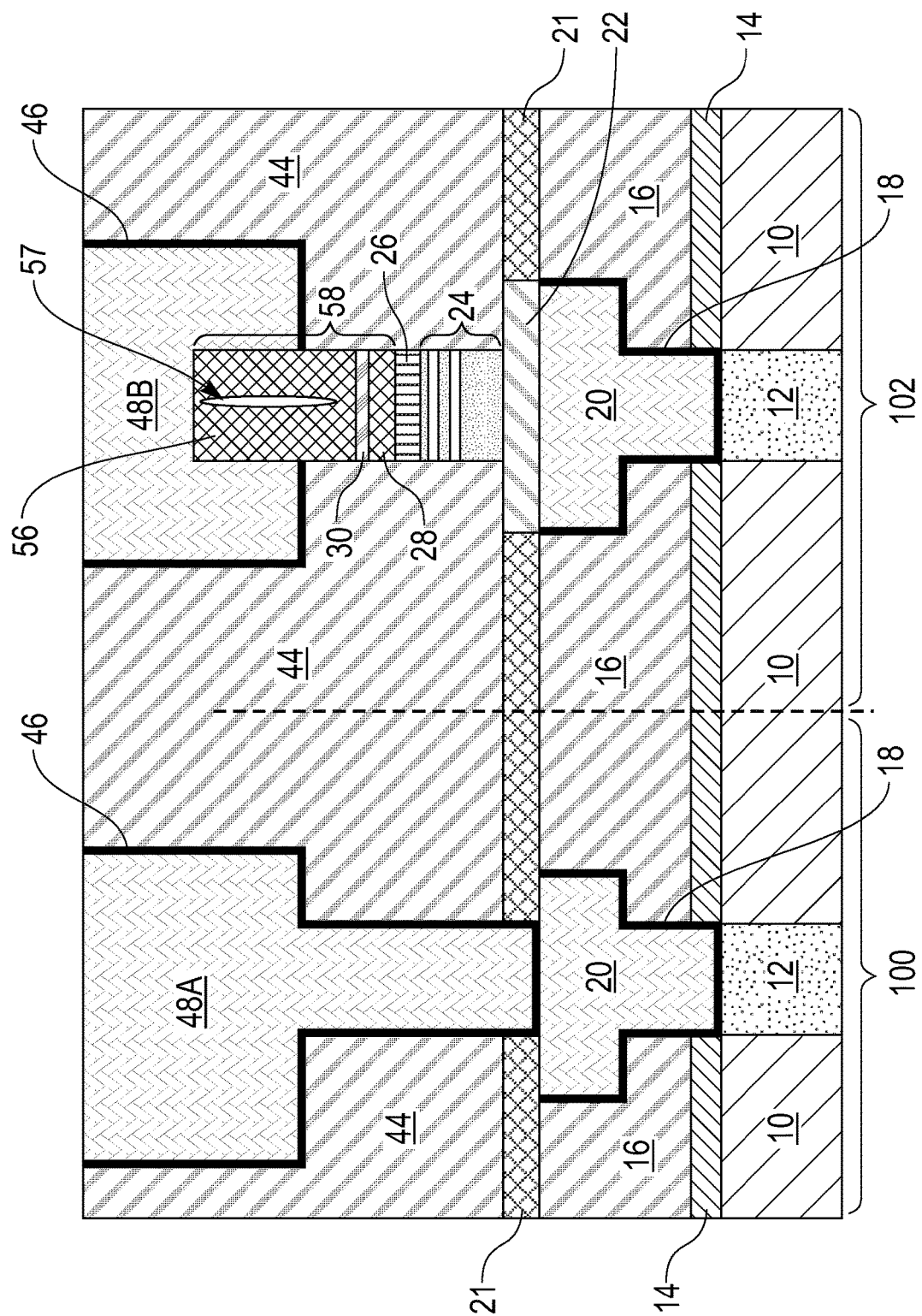
FIG. 12 is a cross sectional view of the second exemplary structure of FIG. 11 after forming an upper interconnect level including a second electrically conductive structure contacting the remaining portion of the upper hardmask layer.

Referring now to FIG. 12, there is illustrated the second exemplary structure of FIG. 11 after forming an upper interconnect level including a second electrically conductive structure 48B contacting the remaining portion of the upper hardmask layer (i.e., the patterned upper hard mask layer 56).

The upper interconnect level of this embodiment of the present application including second interconnect dielectric material layer 44, second diffusion barrier liner 46 and second electrically conductive structures 48A, 48B is the same as defined above for the embodiment depicted in FIG. 5 of the present application.

Figure 13:
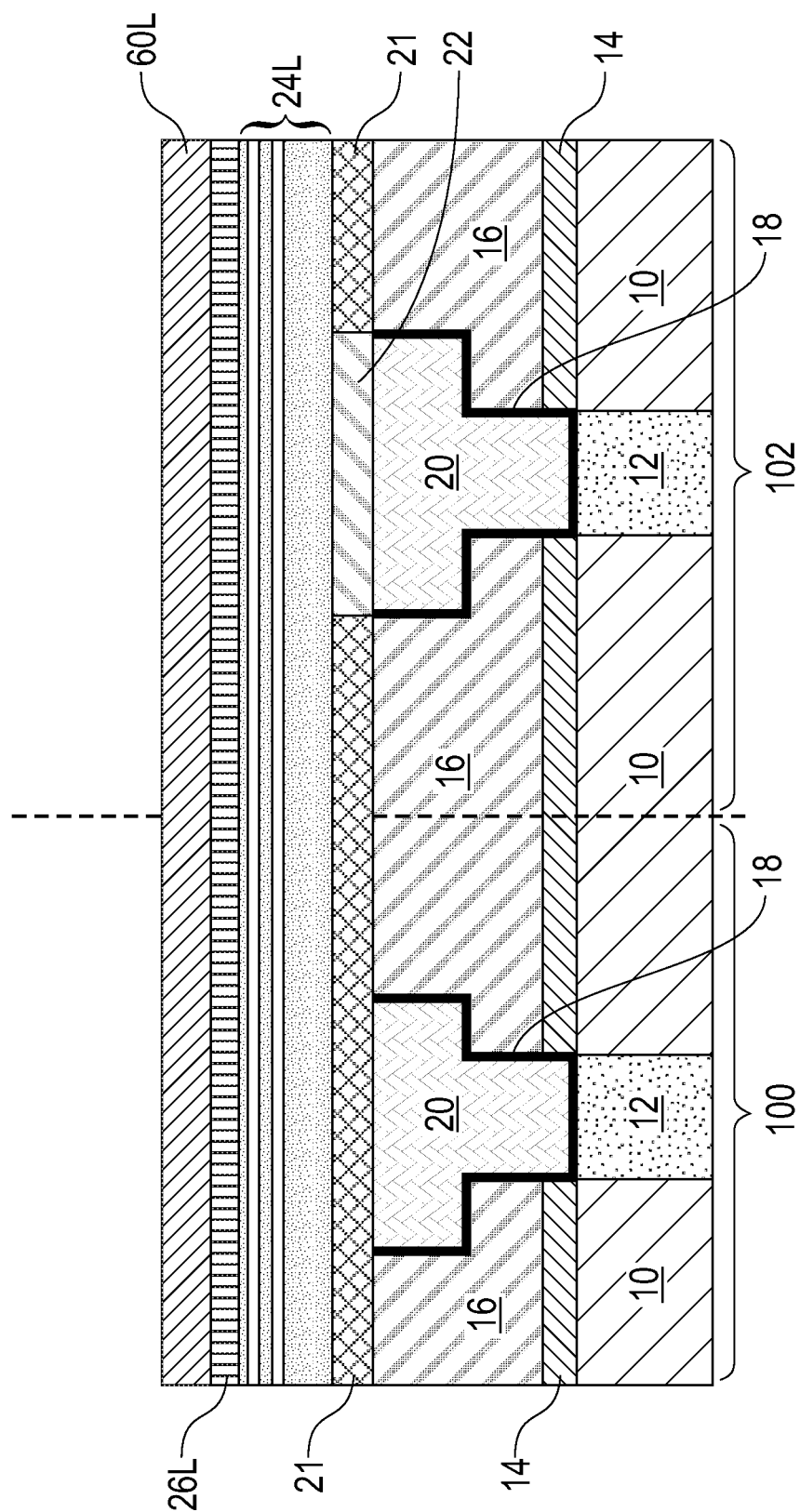
FIG. 13 is a cross sectional view of a third exemplary structure of the present application during an early stage of fabrication, and including a multilayered MTJ structure located above a lower interconnect level, a MTJ cap layer located on the multilayered MTJ structure, and an engineered halogen barrier hardmask layer located on the MTJ cap layer.

Referring now to FIG. 13, there is illustrated a third exemplary structure of the present application during an early stage of fabrication, and including a multilayered MTJ structure 24L located above a lower interconnect level, a MTJ cap layer 26L located on the multilayered MTJ structure 24L, and an engineered halogen barrier hardmask layer 60L located on the MTJ cap layer 26L. The exemplary structure of FIG. 14 includes a non-MRAM device area 100 and a MRAM device area 102.

The exemplary structure of FIG. 13 also includes a MOL level containing a MOL dielectric material layer 10 having contact structures 12 embedded therein. The MOL dielectric material layer 10 and contact structures 12 of MOL level shown in FIG. 13 are the same described above for the MOL level shown in FIG. 1. A dielectric capping layer 14, as defined above, may be present between the MOL level and the lower interconnect level.

The lower interconnect level of this embodiment includes a first interconnect dielectric material layer 16, as defined above, a first diffusion barrier liner 18, as defined above, and first electrically conductive structures 20, as defined above. The exemplary structure may also include dielectric capping layer 21, as defined above, and a conductive landing pad 22, as defined above.

The multilayered MTJ structure 24L and the MTJ cap layer 26L that are employed in this embodiment of the present application are the same as defined above for the embodiment depicted in FIG. 1 of the present application.

The engineered halogen barrier hardmask layer 60L is then formed on the surface of the MTJ cap layer 24L. The engineered halogen barrier hardmask layer 60L is composed of a modified material that is more resistant to halogen diffusion than is the material that provides the MTJ cap layer 26L. The modified material may be composed of Nb, NbN, W, WN, Ta, TaN, Ti, TiN, Ru, Mo, Cr, V, Pd, Pt, Rh, Sc, Al or other high melting point metals or conductive metal nitrides. In one embodiment, the modified material further includes a dopant such as, for example, C, O, S, N, Mn, Al, Sn, or P present therein. The dopant may aid in blocking halogen ions from diffusing through this hardmask layer. In some embodiments, the dopant may be released from the engineered halogen barrier hardmask mask layer 60L and bind with a halogen ion used during the etching process.

In another embodiment, the modified material has a fine-grain structure that traps halogen ions therein. By "fine grain structure" it is meant that the prevailing grain size is <100 nm and provides a plethora of grain boundary sites for containing or reacting with the halogen ions. In one example, the modified material may include exposure to $NH_3$ and $H_2$ plasma.

The engineered halogen barrier hardmask layer 60L may be formed utilizing a deposition process including, for example, CVD, PECVD, ALD, PVD, sputtering, chemical solution deposition or plating. In one embodiment, a dopant may be added to the deposited material during or after the deposition process. The addition of the dopant may include ion implantation, gas phase doping or any other technique which can introduce a dopant into a material layer. In another embodiment, a plasma treatment process can be used after the deposition of the material that provides the engineered halogen barrier hardmask layer 60L. The plasma treatment may include a plasma containing at least one of $N_2$, $H_2$, $NH_3$ and $O_2$.

The engineered halogen barrier hardmask layer 60L may have a thickness from 2 nm to 25 nm; other thicknesses are possible and can be used in the present application as the thickness of the engineered halogen barrier hardmask layer 60L.

Figure 14:
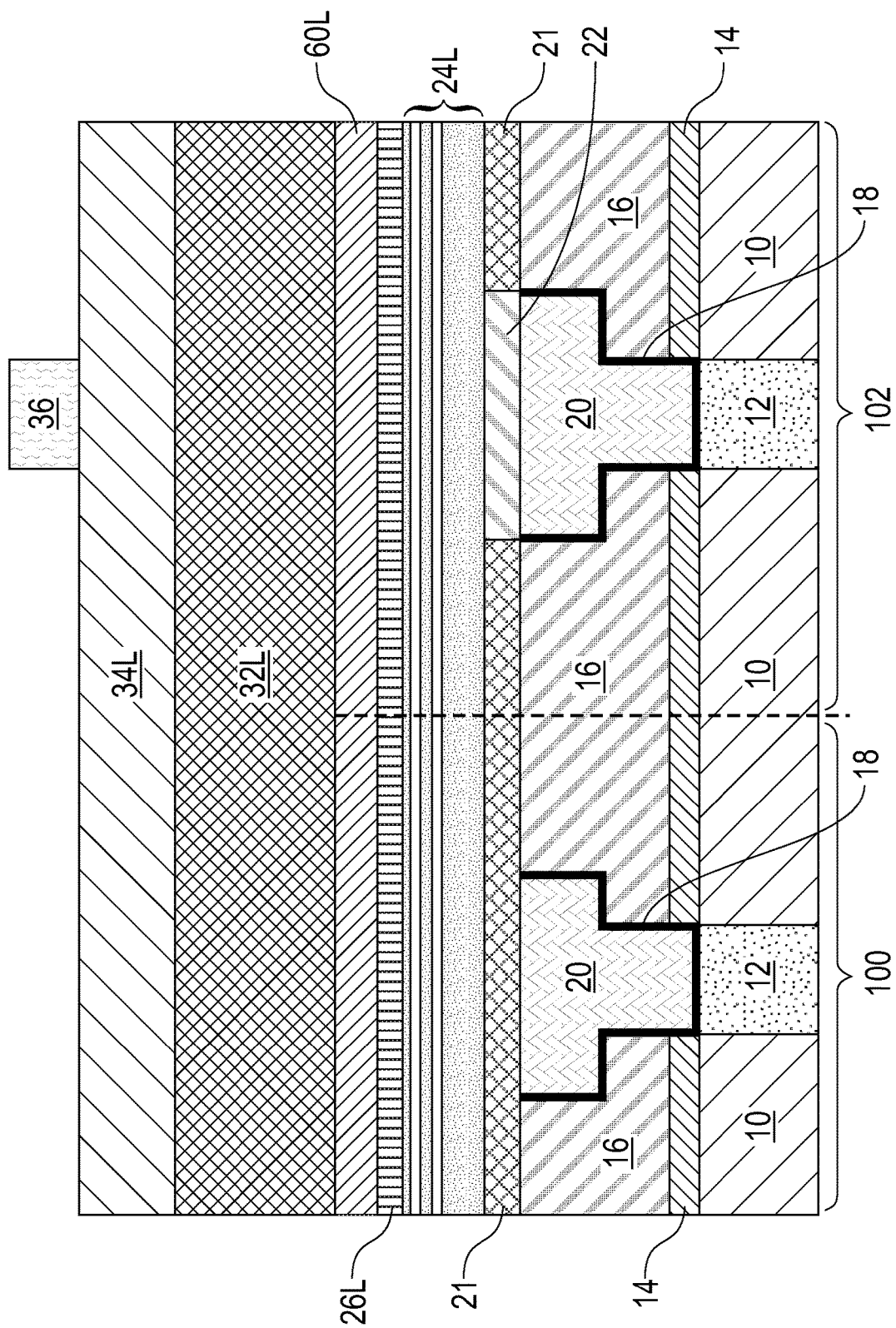
FIG. 14 is a cross sectional view of the third exemplary structure of FIG. 13 after forming an upper hardmask layer on the engineered halogen barrier hardmask layer, an optional dielectric patterning layer on the upper hardmask layer, and a patterned photoresist on the optional patterning dielectric layer and positioned above a first electrically conductive structure present in a MRAM device area of the lower interconnect structure.

Referring now to FIG. 14, there is illustrated the third exemplary structure of FIG. 13 after forming an upper hardmask layer 32L on the engineered etch stop hardmask layer 60L, an optional patterning dielectric layer 34L on the upper hardmask layer 32L, and a patterned photoresist 36 on the optional patterning dielectric layer 34L and positioned above a first electrically conductive structure 20 present in a MRAM device area 102 of the lower interconnect structure. In some embodiments, patterning dielectric layer 34L is not employed.

The upper hardmask layer 32L, the optional patterning dielectric layer 34L, and the patterned photoresist 36 that are employed in this embodiment of the present application are the same as defined above for the embodiment depicted in FIG. 1 of the present application.

Figure 15:
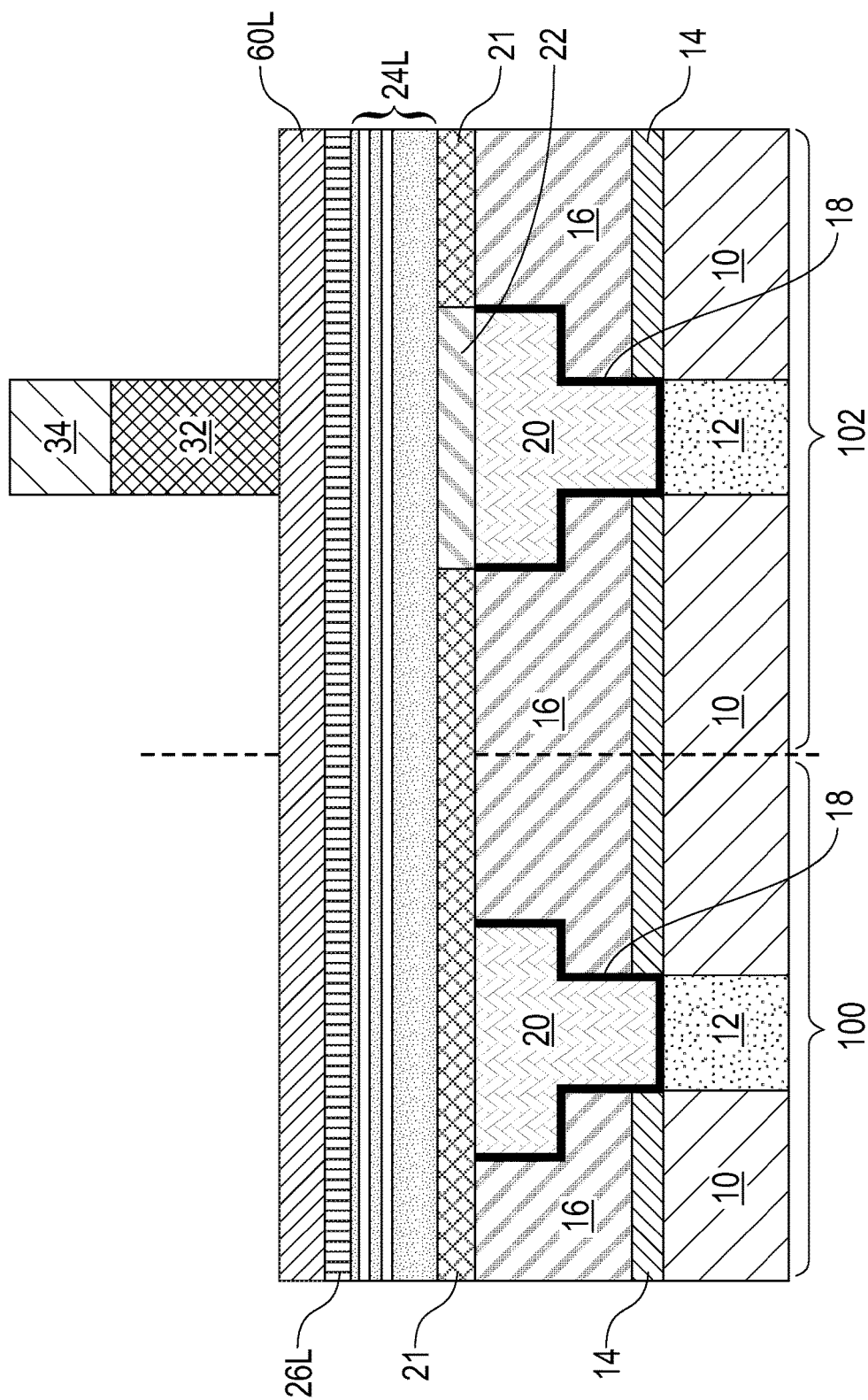
FIG. 15 is a cross sectional view of the third exemplary structure of FIG. 14 after patterning the optional patterning dielectric layer, removing the patterned photoresist, and thereafter patterning the upper hardmask layer utilizing a halogen-based reactive ion etching process and the patterned optional patterning dielectric layer as an etch mask.

Referring now to FIG. 15, there is illustrated the third exemplary structure of FIG. 14 after patterning the optional patterning dielectric layer 34L, removing the patterned photoresist 36, and patterning the upper hardmask layer 32L utilizing a halogen-based reactive ion etching process and the patterned optional patterning dielectric layer 34 as an etch mask. When no patterning dielectric layer 34L is employed, the upper hardmask layer 32L is patterned utilizing the patterned photoresist 36 as an etch mask.

The patterning of the optional patterning dielectric layer 34L may be performed utilizing an anisotropic etching process that is selective in removing the physically exposed portions of the optional patterning dielectric layer 34L that are not protected by the patterned photoresist 36. In one example, a reactive ion etch may be used in removing the physically exposed portions of the optional patterning dielectric layer 34L that are not protected by the patterned photoresist 36. The portion of the optional patterning dielectric layer 34L that remains beneath the patterned photoresist 36 may be referred to herein as a patterned optional patterning dielectric layer 34. The patterned optional patterning dielectric layer 34 is positioned above the first electrically conductive structure 20 present in the MRAM device area 102 of the lower interconnect structure. The patterned photoresist 36 can be removed utilizing a striping process such as, for example, ashing.

After patterning the upper hardmask layer 32L utilizing a halogen-based reactive ion etching process, the remaining upper hardmask layer 32L may be referred to herein as a patterned upper hardmask layer 32. Due to the presence of the engineered halogen barrier hardmask layer 60L, halogen ions that are used during this etch step are prevented from diffusing into the MTJ cap layer 26L and the underlying multilayered MTJ structure 24L.

Figure 16:
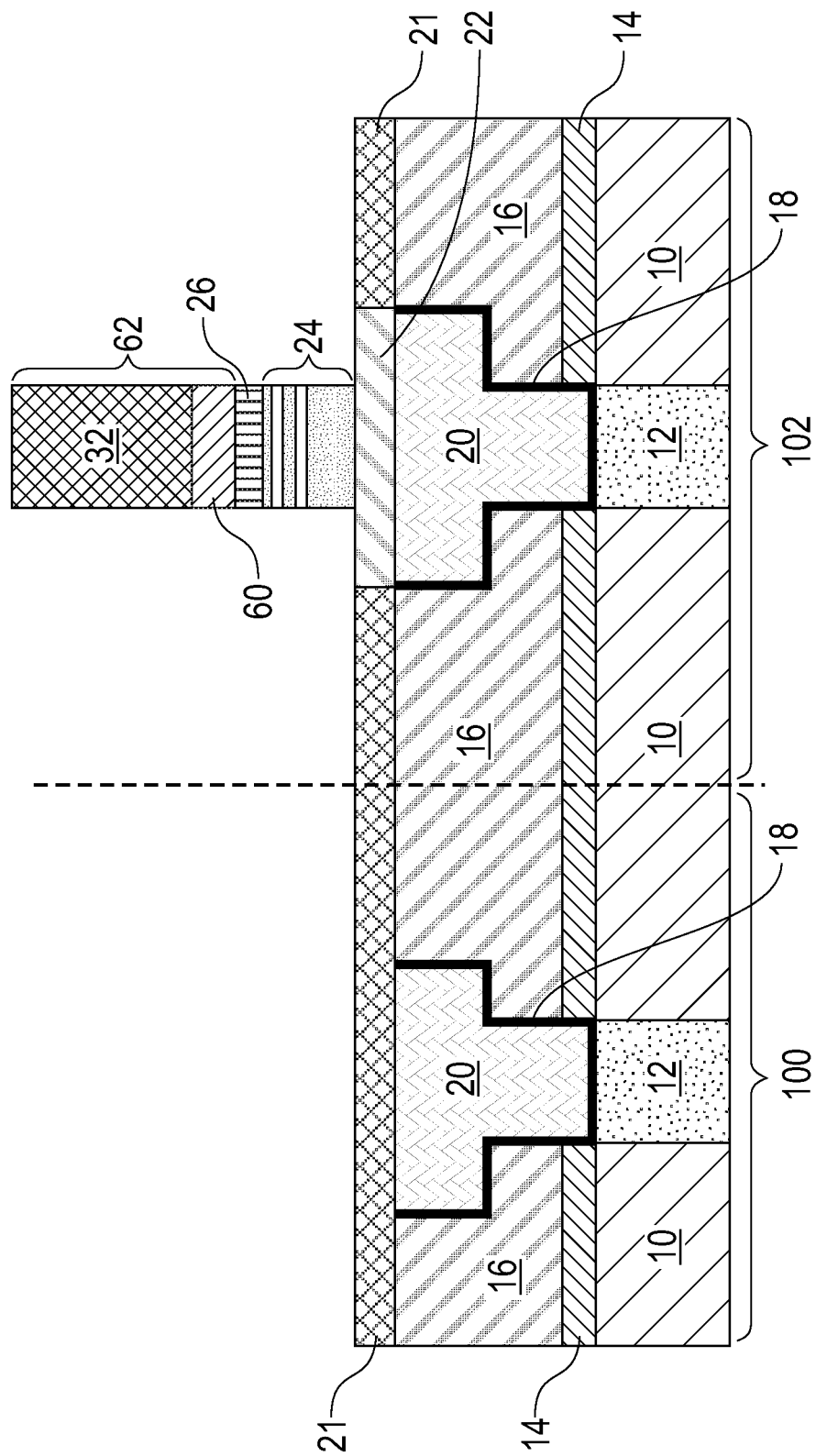
FIG. 16 is a cross sectional view of the third exemplary structure of FIG. 15 after patterning the engineered halogen barrier hardmask layer, the MTJ cap layer and the multilayered MTJ structure utilizing ion beam etching, and removing the patterned optional patterning dielectric layer.

Referring now to FIG. 16, there is illustrated the third exemplary structure of FIG. 15 after patterning the engineered halogen barrier hardmask layer 60l, the MTJ cap layer 26L and the multilayered MTJ structure 24L utilizing ion beam etching, and removing the patterned optional patterning dielectric layer 34 utilizing a conventional stripping process. In the ion beam etching step, the patterned optional patterning dielectric layer 34 and the patterned upper hardmask layer 32 serve as a combined etch mask.

The remaining engineered halogen barrier hardmask layer 60L that is positioned beneath the patterned optional patterning dielectric layer 34 and the patterned upper hardmask layer 32 may be referred to herein as a patterned engineered halogen barrier hardmask layer 260 the remaining MTJ cap layer 26 that is positioned beneath the patterned optional patterning dielectric layer 34 and the patterned upper hardmask layer 32 may be referred to herein as a MTJ cap 26, while the remaining multilayered MTJ structure 24L that is positioned beneath the patterned optional patterning dielectric layer 34 and the patterned upper hardmask layer 32 may be referred to herein as a MTJ structure 24. Collectively, the patterned upper hardmask layer 32, and the patterned engineered halogen barrier hardmask layer 60 provide a multilayered hardmask structure 62 that is located on the MTJ cap 26 which is positioned atop the MTJ structure 24.

As is shown, the multilayered hardmask structure 62 has outermost sidewalls that are vertically aligned to the outermost sidewalls of the MTJ cap 26 and the underlying MTJ structure 24. As is further shown, this pillar of the multilayered hardmask structure 62, MTJ cap 26 and MTJ structure 24 is positioned on the landing pad 22 that is present in the MRAM device area of the exemplary structure. The pillar of the multilayered hardmask structure 38, MTJ cap 26 and MTJ structure 24, when looking from a top down view, typically is circular in shape.

Figure 17:
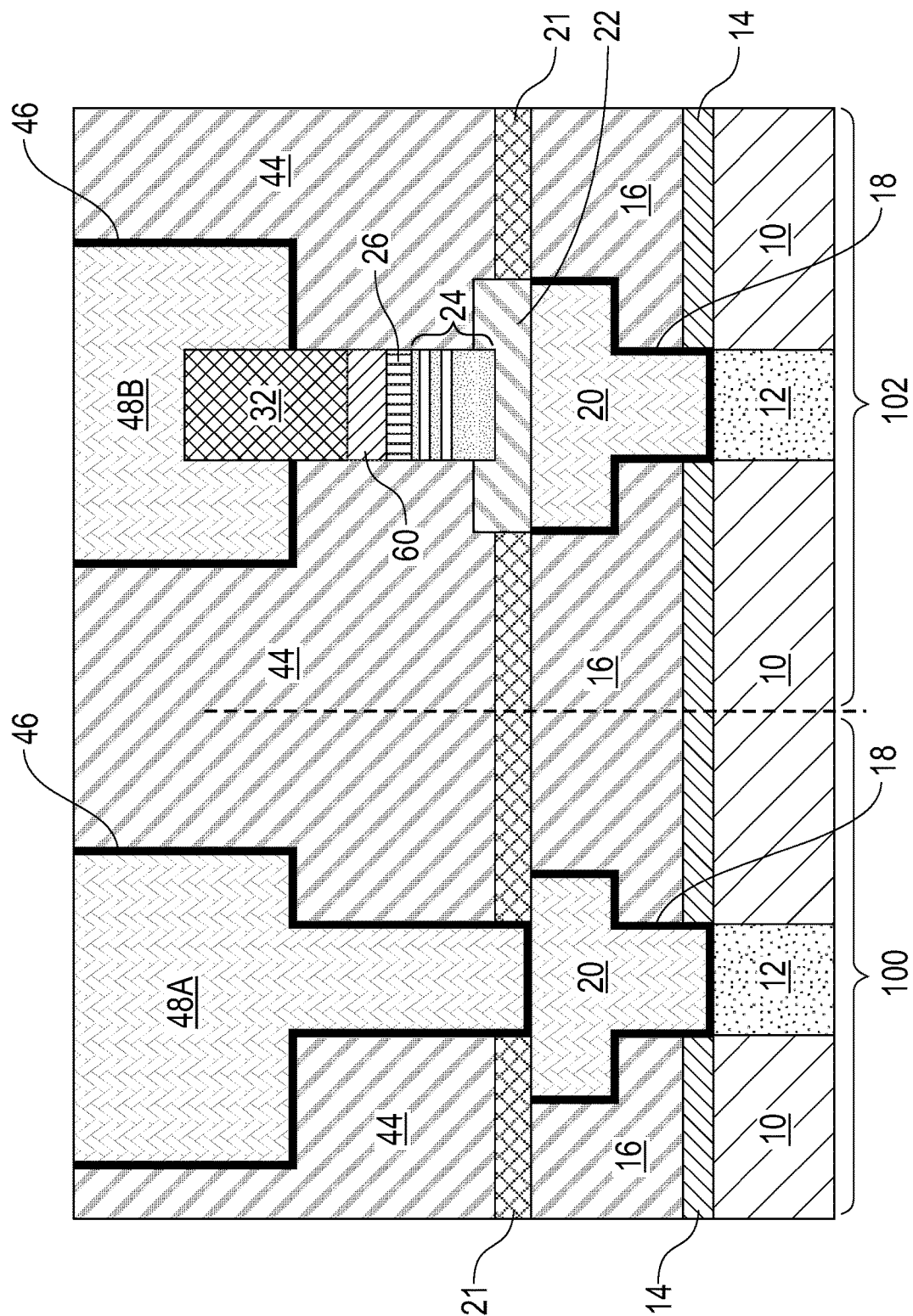
FIG. 17 is a cross sectional view of the third exemplary structure of FIG. 16 after forming an upper interconnect level including a second electrically conductive structure contacting the patterned upper hardmask layer.

Referring now to FIG. 17, there is illustrated the third exemplary structure of FIG. 16 after forming an upper interconnect level including a second electrically conductive structure 48B contacting the patterned upper hardmask layer 32.

The upper interconnect level of this embodiment of the present application including second interconnect dielectric material layer 44, second diffusion barrier liner 46 and second electrically conductive structures 48A, 48B is the same as defined above for the embodiment depicted in FIG. 5 of the present application.

Figure 18A:
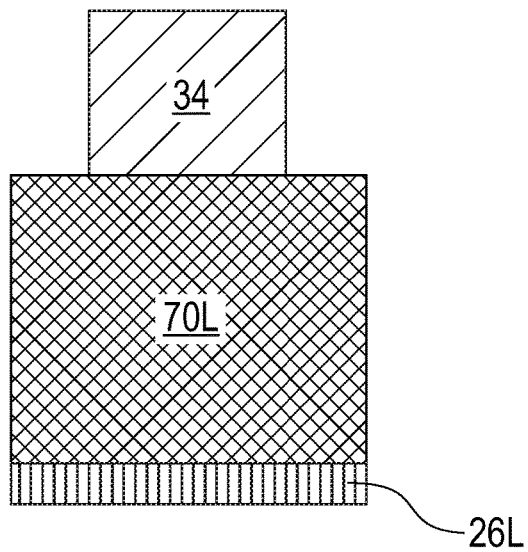
FIG. 18A is a cross sectional view of a fourth exemplary structure of the present application during an early stage of fabrication, and including a MTJ cap layer, a hardmask layer, and a patterned optional patterning dielectric layer.

Referring now to FIG. 18A, there is illustrated a fourth exemplary structure of the present application during an early stage of fabrication, and including a MTJ cap layer 26L, a hardmask layer 70, and a patterned optional patterning dielectric layer 34. In some embodiments, the patterned optional patterned dielectric layer 34 is not employed and a photoresist mask can be used to pattern the hardmask layer 70. Although not depicted in FIG. 18A, the exemplary structure of FIG. 18A would be located on a multilayered MTJ structure that is formed over a lower interconnect level as shown in FIG. 1.

The MTJ cap layer 26L and the patterned optional patterning dielectric layer 34 are the same as described above in FIG. 1 of the present application. The hardmask layer 70L of this embodiment of the present application includes one of the hardmask materials mentioned above for the upper hardmask layer 32. The exemplary structure shown in FIG. 18A can be formed utilizing the processing steps mentioned above in forming the structures shown in FIGS. 1 and 2 of the present application.

Figure 18B:
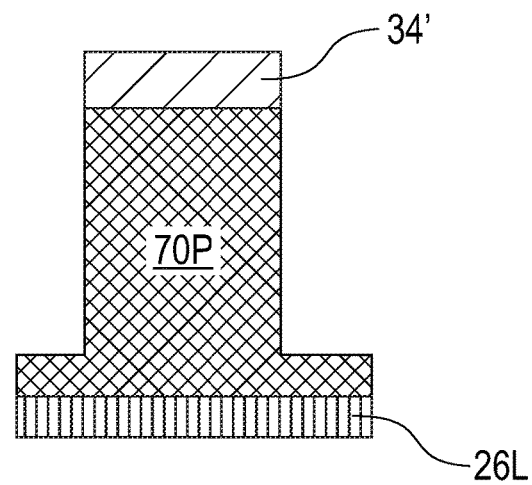
FIG. 18B is a cross sectional view of the fourth exemplary structure of FIG. 18A after performing a timed etching process in which a portion of the hardmask layer, not protected by the patterned optional patterning dielectric layer, is removed.

Referring now to FIG. 18B, there is illustrated the fourth exemplary structure of FIG. 18A after performing a timed etching process in which a portion of the hardmask layer 70L, not protected by the patterned optional patterning dielectric layer 34 or patterned photoresist is removed. The partially etched hardmask layer is depicted as element 70P in FIG. 18B of the present application. During the timed etching process, the patterned optional patterning dielectric layer 34 may be thinned. In FIG. 18B, the thinned and patterned optional patterning dielectric layer is designated as element 34'. This timed etching process limits the exposure of the underlying MTJ cap layer 26L to the etchant used during the timed etching process.

Figure 18C:
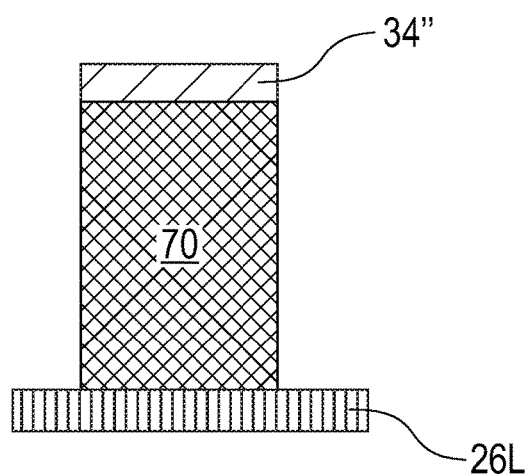
FIG. 18C is a cross sectional view of the fourth exemplary structure of FIG. 18B after performing an ion beam etching process to remove the remaining portion of the hardmask layer, not protected by the patterned optional patterning dielectric layer, while stopping on the underlying MTJ cap layer.

Referring now to FIG. 18C, there is illustrated the fourth exemplary structure of FIG. 18B after performing another etching process to remove the remaining portion of the hardmask layer 70L, not protected by the patterned optional patterning dielectric layer 34', while stopping on the underlying MTJ cap layer 26L. In FIG. 18C, the patterned hardmask layer is designated as element 70, while element 34" denotes a further thinned and patterned optional patterning dielectric layer. The further thinned and patterned optional patterning dielectric layer 34" can be removed and then the processing shown in FIGS. 4 and 5 may be performed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:

providing a first electrically conductive structure embedded in a first interconnect dielectric material layer and located in a magnetoresistive random access memory (MRAM) device area, wherein a conductive landing pad is located on a surface of the first electrically conductive structure;

forming a multilayered magnetic tunnel junction (MTJ) structure and a MTJ cap layer on the conductive landing pad;

forming a halogen barrier hardmask layer over the MTJ cap layer;

forming an upper hardmask layer atop the halogen barrier hardmask layer;

patterning, utilizing a halogen-based etching process, the upper hardmask layer to provide a patterned upper hardmask layer;

patterning the halogen barrier hardmask layer, the MTJ structure and MTJ cap layer utilizing ion beam etching and the patterned upper hardmask layer as an etch mask; and forming a second electrically conductive structure embedded in a second interconnect dielectric material layer and in contact with an upper portion of the patterned upper hardmask layer.

2. The method of claim 1, further comprising forming an etch stop hardmask layer between the halogen barrier hardmask layer and the upper hardmask layer, wherein the patterning of the upper hardmask layer stops on the etch stop hardmask layer, and wherein the etch stop hardmask layer is patterned during the patterning of the halogen barrier hardmask layer, the MTJ cap layer and the multilayered MTJ structure.

3. The method of claim 2, wherein the etch stop layer is composed of a material that is less resistant to halogen diffusion than the material that provides the halogen barrier hardmask layer.

4. The method of claim 1, wherein the halogen barrier hardmask layer includes a dopant, and is in direct physical contact with the upper hardmask layer.

5. The method of claim 4, wherein the halogen barrier hardmask layer is composed of Nb, NbN, W, WN, Ta, TaN, Ti, TiN, Ru, Mo, Cr, V, Pd, Pt, Rh, Sc, or Al, and the dopant comprises C, O, S, N, Mn, Al, Sn, or P.

6. The method of claim 1, wherein the halogen barrier hardmask layer includes a fine grain structure, and is in direct physical contact with the upper hardmask layer.

7. The method of claim 1, wherein the multilayered MTJ structure comprises a magnetic reference layer, a tunnel barrier and a magnetic free layer.

8. The method of claim 1, wherein the halogen barrier hardmask layer is composed of a material that is more resistant to halogen diffusion than a material that provides the MTJ cap layer.

9. The method of claim 1, wherein the halogen barrier hardmask layer prevents halogen ions from diffusion into the MTJ cap layer and the multilayered MTJ structure during the halogen-based etching process.

10. A method of forming a semiconductor structure, the method comprising:
   providing a first electrically conductive structure embedded in a first interconnect dielectric material layer and located in a magnetoresistive random access memory (MRAM) device area, wherein a conductive landing pad is located on a surface of the first electrically conductive structure;
   forming a multilayered magnetic tunnel junction (MTJ) structure and a MTJ cap layer on the conductive landing pad;
   forming a halogen barrier hardmask layer over the MTJ cap layer;
   forming a patterned upper hardmask layer atop the halogen barrier hardmask layer, wherein the patterned upper hardmask layer has a seam located therein;
   patterning, utilizing a halogen-based etching process, the upper hardmask layer to provide a patterned upper hardmask layer having the seam;
   patterning the halogen barrier hardmask layer, the MTJ structure and the MTJ cap layer utilizing ion beam etching and the patterned upper hardmask layer as an etch mask; and
   forming a second electrically conductive structure embedded in a second interconnect dielectric material layer and in contact with an upper portion of the patterned upper hardmask layer.

11. The method of claim 10, wherein the forming of the patterned upper hardmask layer comprises:
   forming an oxide layer having an opening above the halogen barrier hardmask layer;
   depositing an upper hardmask layer on the oxide layer and within the opening;
   removing the upper hardmask layer that is present outside the opening of the oxide layer; and
   removing the oxide layer.

12. The method of claim 11, wherein the oxide layer is a low quality oxide having a high etch rate.

13. The method of claim 10, further comprising forming an etch stop hardmask layer on the halogen barrier hardmask layer prior to forming the patterned upper hardmask layer, wherein the patterning of the upper hardmask layer stops on the etch stop hardmask layer, and wherein the etch stop hardmask layer is patterned during the patterning of the halogen barrier hardmask layer, the MTJ cap layer and the multilayered MTJ structure.

14. The method of claim 10, wherein the multilayered MTJ structure comprises a magnetic reference layer, a tunnel barrier and a magnetic free layer.

15. The method of claim 10, wherein the halogen barrier hardmask layer includes a dopant, and is in direct physical contact with the upper hardmask layer.

16. The method of claim 15, wherein the halogen barrier hardmask layer is composed of Nb, NbN, W, WN, Ta, TaN, Ti, TiN, Ru, Mo, Cr, V, Pd, Pt, Rh, Sc, or Al, and the dopant comprises C, O, S, N, Mn, Al, Sn, or P.

17. The method of claim 10, wherein the halogen barrier hardmask layer includes a fine grain structure, and is in direct physical contact with the upper hardmask layer.

* * * * *